(12) United States Patent
Orofino, II

(10) Patent No.: US 10,514,399 B1
(45) Date of Patent: Dec. 24, 2019

(54) MEASUREMENT OF ALTERNATING ELECTRIC CURRENT VIA ELECTROMAGNETIC DYNAMIC SENSOR MEASUREMENTS

(71) Applicant: Donald P. Orofino, II, Sudbury, MA (US)

(72) Inventor: Donald P. Orofino, II, Sudbury, MA (US)

(*) Notice: Subject to any disclaimer, the term of this patent is extended or adjusted under 35 U.S.C. 154(b) by 200 days.

(21) Appl. No.: 15/671,689

(22) Filed: Aug. 8, 2017

(51) Int. Cl.
| G01R 15/16 | (2006.01) |
| G01R 21/133 | (2006.01) |
| G01R 29/08 | (2006.01) |
| G01R 35/00 | (2006.01) |
| G01R 21/14 | (2006.01) |
| G01R 21/08 | (2006.01) |
| G01R 15/20 | (2006.01) |

(52) U.S. Cl.
CPC ......... *G01R 21/133* (2013.01); *G01R 15/207* (2013.01); *G01R 21/08* (2013.01)

(58) Field of Classification Search
CPC ..... G01R 21/133; G01R 15/207; G01R 21/08
USPC ............ 702/60, 61, 64, 66, 67, 75; 324/202
See application file for complete search history.

(56) References Cited

U.S. PATENT DOCUMENTS

| 3,714,516 A | 1/1973 | Howe |
| 4,612,617 A | 9/1986 | Laplace, Jr. et al. |
| 4,706,073 A | 11/1987 | Vila Masot |
| 4,716,409 A | 12/1987 | Hart et al. |
| 4,804,957 A | 2/1989 | Selph et al. |
| 4,858,141 A | 8/1989 | Hart et al. |
| 5,196,982 A | 3/1993 | Landsberg et al. |

(Continued)

FOREIGN PATENT DOCUMENTS

| CN | 201201017 Y | 3/2009 |
| DE | 102007032053 A1 | 1/2009 |

OTHER PUBLICATIONS

Berges, M., et al., "Enhancing Electricity Audits in Residential Buildings with Nonintrusive Load Monitoring," Journal of Industrial Ecology, vol. 14(5):844-858, 2010.

(Continued)

*Primary Examiner* — John H Le
(74) *Attorney, Agent, or Firm* — Nelson Mullins Riley & Scarborough LLP; Anthony A. Laurentano

(57) ABSTRACT

A system provides indirect current measurement using dynamic sensing of rapidly changing electromagnetic fields. This measurement is achieved using non-contact sensors that are positioned over electric circuit breaker bodies. The system enables the use of readily available, low-cost, mass-produced digital electromagnetic sensors to measure current for circuits in a building. The system may estimate peak electromagnetic field strength from unsynchronized sensor samples. The system may compensate for the low sample rate of the sensors. The system may compensate for smoothing that is performed by sensors so as to be usable as a sensor for a dynamic electromagnetic applications. The system may account for the presence of measurement leakage that causes electromagnetic field distortion. Moreover, the system may infer the electric equipment in use, its time of operation and activity state based on estimates of the alternating electromagnetic field and the use of machine learning or machine intelligence algorithms.

43 Claims, 16 Drawing Sheets

(56) References Cited

U.S. PATENT DOCUMENTS

| | | | |
|---|---|---|---|
| 5,414,344 | A | 5/1995 | Chinn |
| 5,767,667 | A | 6/1998 | Shafie |
| 5,995,911 | A | 11/1999 | Hart |
| 6,330,516 | B1 | 12/2001 | Kammeter |
| 6,853,291 | B1 | 2/2005 | Aisa |
| 7,049,976 | B2 | 5/2006 | Hunt et al. |
| 7,054,770 | B2 | 5/2006 | Swarztrauber et al. |
| 7,276,915 | B1 | 10/2007 | Euler et al. |
| 7,400,986 | B2 | 7/2008 | Latham et al. |
| 7,528,593 | B2 | 5/2009 | Tanizawa |
| 7,755,347 | B1 | 7/2010 | Cullen et al. |
| 7,912,530 | B2 | 3/2011 | Seki et al. |
| 8,344,724 | B2 | 1/2013 | Leeb et al. |
| 8,805,628 | B2 | 8/2014 | Patel et al. |
| 8,924,604 | B2 | 12/2014 | Yogeeswaran et al. |
| 8,930,152 | B2 | 1/2015 | Patel et al. |
| 8,972,211 | B2 | 3/2015 | Yogeeswaran et al. |
| 9,291,694 | B2 | 3/2016 | Maguire et al. |
| 9,594,098 | B2 | 3/2017 | Patel et al. |
| 9,766,277 | B2 | 9/2017 | Patel et al. |
| 9,857,449 | B2 | 1/2018 | Maguire et al. |
| 9,995,815 | B2 | 6/2018 | Beiner et al. |
| 2010/0188262 | A1 | 7/2010 | Reymann et al. |
| 2017/0090003 | A1* | 3/2017 | Guo ............... G01R 35/00 |
| 2018/0306839 | A1* | 10/2018 | Donnal ............ G01R 21/133 |

OTHER PUBLICATIONS

Berges, M., et al., "Non-Intrusive Load Monitoring: A Review of the State of the Art," NILM Workshop, Carnegie-Mellon University Civil & Environmental Engineering, 27 pages, May 2012.

Berges, M., et al., "Training Load Monitoring Algorithms on Highly Sub-Metered Home Electricity Consumption Data," Tsinghua Science and Technology, vol. 13(S1):406-411 Oct. 2008.

Chetty et al., "Getting to Green: Understanding Resource Consumption in the Home." UbiComp 2008: 242-251, 2008.

Clifford, Z., et al., A Retrofit 60 Hz Current Sensor for non-instrusive Power Monitoring at the Circuit Breaker Panel, 2010. https://dspace.mit.edu/openaccess-disseminate/1721.1/71145, 9 pages.

Drenker et al., "Nonintrusive monitoring of electronic loads." IEEE Computer Applications in Power, pp. 47-51, Oct. 1999.

enOcean, Current Sensor—Power Line Monitoring for Energy Demand Control, Application note AN-308, Jan. 2015, 4 pages.

Gupta, S., et al., "ElectriSense: Single-Point Sensing Using EMI for Electrical Event Detection and Classification in the Home," UbiComp 2010, 10 pages, Sep. 26-29, 2010.

Hart, George W., "Nonintrusive Appliance Load Monitoring," Proceedings of the IEEE, vol. 80 (12):1870-1891 (1992).

Heintzelman, S. "Non-contact circuit for real-time electric and magnetic field measurements," Oct. 2015, 24 pages, US Army Research Labs, <https://techlinkcenter.org/wp-content/uploads/2018/05/ADA624388.pdf>.

Iwafune, Y., et al., "Detection of operating condition in home appliances using current data on electric distribution boards", 2012 IEEE PES Innovative Smart Grid Technologies (ISGT), 7 pages.

Kientz et al., "The Georgia Tech Aware Home." Human-Computer Interaction—CHI 2008: 3675-3680 (2008).

Laughman, C., et al. "Power signature analysis," IEEE Power and Energy Magazine, Mar./Apr. 2003, pp. 56-63, 2003.

Lorek, M.C., et al., "COTS-based stick-on electricity meters for building submetering". 2013 IEEE Sensors, 1-4 (2013).

Murata et al., "Estimation of Power Consumption for Household Electric Appliances." Proceedings of the 9th International Conference on Neural Information Processing: 2299-2303: (2002).

P3 International, "Kill a Watt.TM., Electricity Usage Monitor", Innovative Electronic Solutions, <http://www.p3international.com/products/special/P4400/P4400-CE.html>, 2008, 1 page. <http://www.p3international.com/manuals/p4400_manual.pdf>.

Patel et al., "PowerLine Positioning: A Practical Sub-Room-Level Indoor Location System for Domestic Use." UbiComp 2006: 441-458, 2006.

Prudenzi, A., "A Neuron Nets Based Procedure for Identifying Domestic Appliances Pattern-of-Use from Energy Recordings at Meter Panel." IEEE pp. 941-946, 2002.

Ramirez-Munoz et al., "Design and experimental verification of a smart sensor to measure the energy and power consumption in a one-phase AC line." Measurement vol. 42: 412-419, Aug. 2008.

Warner, Chris, Hall-Effect Sensors Measure Up, ECN Magazine, https://www.ecnmag.com/print/articles/2009/03/sensor-zone-april-2009, Apr. 2009, 5 pages.

Wood, G., Newborough, M., "Energy-use Information Transfer for Intelligent Homes: Enabling Energy Conservation with Central and Local Displays." Energy and Buildings, vol. 39: 495-503, 2007.

Xu, Q. et al., "Integrated centralized electric current monitoring system using wirelessly enabled non-intrusive ac current sensors," in Sensors, 2011 IEEE, 2011, pp. 1998-2001.

Zeifman, M., et al., "Non-intrusive appliance load monitoring,(NIALM): Review and Outlook," International Conference on Consumer Electronics, Las Vegas NV, 27 pages, Jan. 2011, <https://www.cse.fraunhofer.org/hs-fs/hub/55819/file-14742612-pdf/docs/nialm-ieee-2011.pdf>.

* cited by examiner $$m_4 = s_4 * f(4,4)$$

$$m_4 = s_3 * f(3,4) \\ + s_4 * f(4,4)$$

$m_4 = s_1 * f(1,4)$
$+ s_2 * f(2,4)$
$+ s_3 * f(3,4)$
$+ s_4 * f(4,4)$
$+ s_5 * f(5,4)$
$+ s_6 * f(6,4)$

MEASUREMENT OF ALTERNATING ELECTRIC CURRENT VIA ELECTROMAGNETIC DYNAMIC SENSOR MEASUREMENTS

BACKGROUND

There is an increasing interest in monitoring energy consumption and production. One of the quantities of interest is electricity consumption and production. Many have an interest in knowing how much electricity is used by electrical devices, or which circuit within an electrical system or within a region such as a commercial or residential building is supporting those electrical devices. Others may wish to track how much electricity is begin produced by a photovoltaic array (PVA) system on a building rooftop. Still others may wish to receive insight based on electricity usage, such as which appliances or machinery are operating, and when and for how long. One approach to knowing electricity consumption and production is to measure the electric current demanded by these circuits. Of particular interest is measuring alternating electric current (AEC) as it is a primary means of electricity transmission and delivery over long distances in public electric systems and national power grids. AEC is typically used in the distribution of electricity within commercial and residential buildings, and indicates the electricity is changing amplitude over time, often in a cyclical or sinusoidal manner.

Conventional monitoring systems for monitoring AEC require direct electrical connection to each circuit, splicing into the flow of electricity in each circuit, positioning of a measurement coil around the transmission line or wire in each circuit, or adding a sensor to electric outlets at each point where electric equipment is located throughout a residence or a commercial building. These conventional monitoring systems have inherent limitations, some of which include a high cost of the system, a high cost of installation, a high risk of injury to the installer while installing the system, and the need for modification or disruption to each circuit being monitored during installation. Recent methods for non-contact electricity monitoring include expensive, specialized sensors and complex placement procedures to ensure practical measurement of each circuit. Overcoming these limitations may enable much greater use of electricity consumption and production monitoring.

SUMMARY

In an exemplary embodiment, a method is performed in a device having a processor. Per this method, two or more unsynchronized samples of data are received from at least one non-contact sensor of the electromagnetic field strength that is positioned in proximity to a circuit breaker body through which AEC flows. With the processor, electromagnetic field strength is estimated based on the received two or more measurements of the alternating electromagnetic field (AEF). The processor may also be used to determine the AEC amplitude for the current flowing through the circuit breaker body from the estimated electromagnetic field strength. Information regarding the AEC amplitude flowing through the circuit breaker body may be displayed on a display, stored in a storage medium and/or passed to an application, for example. The two or more measurements of the AEF may be measurements of the magnetic field received from a magnetometer, such as a three-axis flux-gate magnetometer. Determining the magnetic field strength of a dynamically varying magnetic field poses a difficult estimation problem, as cost-effective, consumer-grade sensors return values based on the assumption of a strong, static magnetic field. This assumption is viable when consumer-grade magnetometers are used as part of a magneto-static application such as an electronic compass that measures the magnetic field of the Earth. This assumption has stymied use of consumer-grade sensors in magneto-dynamic applications however. Several specific issues have been identified that impede use of magneto-static sensors in the magneto-dynamic application of AEC measurement. An analogous set of sensors and issues applies when estimating AEC from measurements of the electric field. These issues are enumerated below and are now resolved and enabled in practice by the novel exemplary embodiments described herein.

First, the amplitude of the AEF at the alternation frequency needs to be identified by the measurement system over time. However, sensors such as magnetometers are not synchronized to the time at which the peak amplitude of the AMF occurs, so the peak amplitude is not specifically measured or returned by the sensor. A value representing the peak amplitude of the AEF at the alternation frequency must therefore be estimated from measurements taken at sampling points with known but unsynchronized timing. Moreover, if a sensor is positioned over the grounded metal plate of an electric distribution panel (also referred to as an electrical panel), the electromagnetic field is particularly weak, and the sensor is positioned far from wires carrying the AEC that lie typically several inches under the panel cover. A better positioning of the sensor is to place it over the circuit breaker body itself, which consists of non-conductive insulator through which electromagnetic fields propagate more freely than through a grounded conductive panel, and within which conducting metal structures lie only tenths of an inch from the sensor. Therefore, estimating electromagnetic field strength may include estimating the amplitude of the AEF at the alternation frequency, from the unsynchronized measurements returned by a sensor positioned over a circuit breaker body Second, the two or more samples of data may be received at a sampling interval that is longer than a Nyquist interval corresponding to the alternation frequency, due to the longer sampling intervals inherent to consumer-grade, low-cost digital sensors, including for example magnetometers intended for use in electronic compass applications. Also motivating the use of longer sampling intervals is the desire to minimize the number of data samples processed per time interval by a system, which allows for slower and less expensive processors for the system. Longer sampling intervals also enable a data bus with a certain data bandwidth to service more sensors before reaching its maximum capacity. Conventional techniques applied to the problem of amplitude estimation such as a Fast Fourier Transform (FFT) fail for sampling intervals longer than the Nyquist interval. A novel solution that jointly addresses this and the aforementioned limitation estimates the amplitude of the electromagnetic field at the alternation frequency and accommodates a long sampling interval by applying certain least-squares estimators, such as the minimum variance unbiased estimator (MVUE). These estimators employ a mathematical model of the problem, wherein the estimators are configured to assume a sinusoidal amplitude variation at a specified alternation frequency, and the model enables these estimators to operate with data sampled at time intervals longer than the Nyquist interval. This is a novel use of an estimator for an unanticipated application: magneto-dynamic field estimation at a predetermined alternation frequency from unsynchronized, long-interval magneto-static sensor measurements. This further implies a need to automatically estimate the alternation frequency itself, so that the installer or end-user of the system is not required to manually enter the alternation frequency. This automation is done by estimating the amplitude at multiple candidate alternation frequencies and choosing the frequency with the greatest estimated amplitude. An analogous set of sensors, problems and solution applies when estimating field strength from an electric field instead of a magnetic field.

Third, the non-contact electromagnetic sensor may smooth samples of data over time to reduce measurement noise, such smoothing performed for use with static electromagnetic field measurements. The embodiments may compensate for the smoothing of the samples by computing and applying a compensation coefficient based on analysis of the smoothing parameters and alternation frequency of the AEF. For example, scaling adjustments may be made to the measurements or to the estimated amplitude at the AEF. Without this compensation, estimation of the amplitude at the alternation frequency including techniques based on the example embodiment using MVUE will fail to correctly estimate this amplitude. This is another novel accommodation that enables use of a consumer-grade sensor in an unintended application involving a dynamically-varying field.

Fourth, in multi-source, multi-sensor measurement systems wherein distant radiating sources (i.e., the field emanating from other circuit breakers) may impart non-negligible field contributions to a local sensor measurement (i.e., the field at the local circuit breaker), source leakage may be present. This introduces an error in the measurement at the local circuit breaker and this leakage should be reduced. The system solution presented herein incorporates automatic leakage assessment based on a novel system involving calibration with a predetermined current flow coupled with a computational technique for leakage reduction based on a set of sensor measurements that include leakage.

Finally, by use of the methods and systems described above, the application of machine learning techniques, such as deep learning, can be applied advantageously to the AEF or AEC estimates to enable inference about the electric equipment that is consuming electric current. This use of machine learning is a significant benefit to the operator or user of the AEC measurement system, by automatically generating inferences about which equipment is in operation, the timing of the start and end of use, and the length of time of operation of such equipment. These beneficial outcomes of machine learning applied to AEC estimates are enabled by use of the methods described above.

In accordance with an exemplary embodiment, a non-transitory computer-readable storage medium stores instructions that when executed on a processor cause the processor to receive two or more unsynchronized samples of data from at least one non-contact magnetic field sensor positioned in proximity to a circuit breaker body through which AEC flows. The instructions also cause the processor to estimate a total magnetic field strength based on the received two or more samples of unsynchronized data and to determine AEC amplitude for the AEC flowing through the circuit breaker body from the estimated magnetic field strength. The AEC amplitude flowing through the circuit breaker body may be displayed on the display, stored in a storage, passed to an application, or the like.

In accordance with an exemplary embodiment, a device includes a display, a storage and a processor. The processor receives two or more unsynchronized samples of data from at least one non-contact sensor of electromagnetic energy positioned in proximity to a circuit breaker through which AEC flows. The processor estimates the electromagnetic field strength based on the received two or more samples of data and determines AEC amplitude for the current flowing through the circuit breaker provided from the estimated electromagnetic field strength. The processor may also display on a display, store in a storage or pass to an application information regarding the current amplitude flowing through the circuit breaker body in amperes. Alternative quantities related to the AEC may be computed or displayed, including, for example, electric power in Watts or energy in Joules. Inference regarding electrical activity, including which electric equipment is operating, and for how long and when it began operating, may also be communicated or displayed.

DETAILED DESCRIPTION

Figure 1:
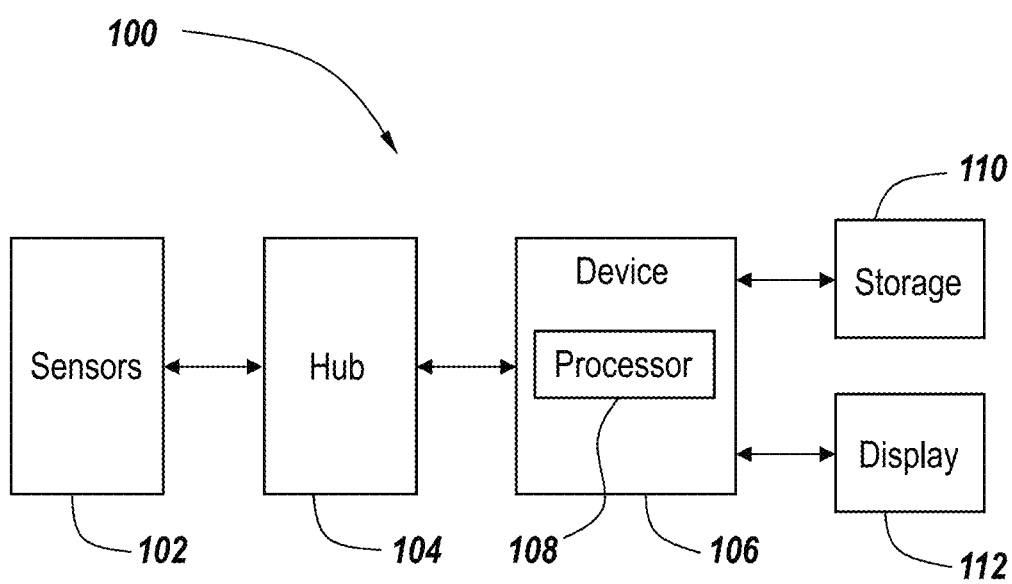
FIG. 1 depicts a block diagram of components found in a system in accordance with an exemplary embodiment.

The exemplary embodiments described herein provide for the determination of alternating electric current (AEC) flowing through circuits. The exemplary embodiments include sensors for measuring the alternating electromagnetic field (AEF), and reporting the AEC as derived from the AEF. An exemplary embodiment measures the magnetic field corresponding to the AEC flowing through circuit breakers located in an electrical panel. In the exemplary embodiments described herein, the sensors are positioned on a front face of circuit breakers and are configured to assume a desired position relative to where the current flows through the circuit breakers.

Sensor Technology

In the exemplary embodiment, the AEF sensors may be, for example, magnetic field sensors (also known as a magnetometer), such as three-axis flux-gate magnetometers. Consumer-grade magnetometers are often produced as application-specific integrated circuit (ASIC) devices and typically contain several subsystems within the ASIC. A first subsystem within the magnetometer sensor may be an analog measurement unit that measures the magnetic field, and may be constructed using a Hall effect sensor, a magneto-resistive device, a fluxgate device, or a device that employs another technique for electromagnetic field measurement. The analog value corresponding to the magnetic field measurement may be digitized internally within the ASIC device. The digital value may be made accessible to an external processor using a digital data bus. The digital data bus may be a serial data bus which could be created according to the SPI (Serial Peripheral Interface) or I2C (Inter-Integrated Circuit) protocol. The SPI and I2C data buses are common choices for consumer-grade digital magnetometer devices, and the choice of data bus influences the electrical interconnection from the ASIC to the processor, as well as the electrical specifications and software protocols used to transfer the digital values across the data bus. These same data buses may also be used to adjust control values provided by the AMF sensor which may include the time interval of digital sampling, the parameters of oversampling or averaging filters, and the like. Other data buses may be utilized for accessing values from sensors.

Similar to the above, the AEF sensors may be, for example, electric field sensors, such as Rogowski wire coils attached to a voltage amplifier, Hall effect devices, or fluxgates. The analog value corresponding to the electric field measurement may also be digitized and presented on a digital data bus. Thus, one skilled in the art will recognize that electric and/or magnetic fields may be measured and utilized to derive the AEC using the techniques for digital computation disclosed below.

Assuming a digital magnetometer such as the NXP MAG3110 Three-Axis Digital Magnetometer that uses the I2C digital serial bus protocol, the format of the input received by a processor from the sensor may be further detailed. According to the device specification, after I2C registers on the magnetometer are configured for use according to the desired sensor sample interval and other control values, another register on the device may be read by a processor to receive the value of the magnetic field. The magnetic field is measured at a sample instant specified by a timing generator internal to the device that has a timing interval according to the preset control value; as mentioned earlier, measurement timing remains unsynchronized to the peak of the electromagnetic field itself. When the measurement is ready to be communicated over the I2C bus, a digital interrupt pin on the device is activated. In response to the interrupt, the processor requests data from the device at the specified register address. Typically, the data is communicated in 8-bit units. For the MAG3110 sensor, two 8-bit bytes must be transferred to receive and reconstruct a full 16-bit digital value corresponding to the magnetic field value for each axis of the three-axis magnetic field measurement. Three 16-bit values must therefore be transferred in succession, or 6 bytes in total, to fully determine the magnitude of the magnetic field at that time instant. Once received, the pin signaling the interrupt returns to its inactive state, in preparation to return to the active state once another magnetic field sample is ready for transfer at the next sample timing interval. In this manner, a stream of data is periodically communicated from magnetometer device to processor as a series of transactions over the I2C serial data bus. For the MAG3110 sensor, these 16-bit words are representations of the magnetic field strength using the signed 2's complement digital value format and may be interpreted in units of micro-tesla.

Sensor Placement

One of the advantages of the system described herein is that the sensors are non-contact sensors. Unlike conventional systems, the system described herein does not require splicing of sensors into the electric wiring of a circuit and does not require the passing of individual wires through sensor coils. Such splicing of circuits may require opening of the electrical panel, followed by rewiring of the electric circuits within the electrical panel. Splicing of circuits alternatively may require accessing the conduit of wire leading into and out of the electrical panel, exposing individual wires within those conduits, and splicing sensors into those individual circuits. Sensor coils may require passing individual wires within the electrical panel or within wire conduits through individual sensor coils. These are highly invasive steps and are potentially injurious to the installer.

This may be contrasted with an exemplary embodiment of the system described herein, which provides for the attachment of measurement devices outside the electrical panel, with no need for opening the electrical panel, and with no knowledge of, access to, or adjustment for the location of wires within the electrical panel. The system described herein may also be installed without access to, or knowledge of the locations of, wires or transmission lines in circuits to be monitored, and without access to individual wires within those conduits.

In order to appreciate how the AEC amplitude is calculated, it is worth noting that there is a relationship between electric current and magnetic field. In particular, an electric current is accompanied by a corresponding magnetic field. The magnitude of the electric current, the direction of the electric current, and the proximity of the electric current to where the magnetic field is measured all influence the magnetic field measurements. Since in the present case, the current is alternating over time, the magnetic field generated by the current is dynamically changing.

The relationship between the magnetic field and the electric current when the current is flowing through a straight, infinitely long wire may be expressed as follows:

$$B = \frac{\mu_0 I}{2\pi R} = \frac{I}{R} \times 2 \times 10^{-7}$$

where $\mu_0$ to is magnetic permeability (defined to be $4\pi \times 10^{-7}$ for a vacuum), I is electric current measured in amperes, B is magnetic flux density measured in Tesla, and R is distance of the magnetic field measurement to the conductor in meters. Based on this equation, the current may be approximately determined from the magnetic flux density. Hence, for the exemplary embodiment, the magnetic field values generated by the sensors may be used to estimate the current amplitude for the AEC flowing through the associated circuit breakers.

If a sensor is positioned over the grounded metal plate of an electrical panel, the electromagnetic field is particularly weak, and the sensor is thereby positioned far from wires carrying the AEC that lie typically several inches under the panel cover. A better positioning of the sensor is to place it over the circuit breaker body formed of non-conductive insulator through which electromagnetic fields propagate more freely than through a grounded conductive panel, and within which metal conductors lie only tenths of an inch from the sensor. According to the preceding relationship for flux density detailed in the above equation, the difference between a source distance R of two inches and a source distance R of two tenths of an inch is a ten-fold increase in magnetic flux density, B. This closer positioning of the sensor to electrical conductors allows for a ten-fold decrease in sensitivity of the sensor, which allows for a much more inexpensive consumer-grade sensor, given that the sensor is positioned over the circuit breaker versus over the electrical panel. Alternatively, this allows for a ten-fold improvement in minimum AEC detectable by the sensor. Therefore, it is advantageous to estimate the field strength by estimating the amplitude of the AEF at the alternation frequency, from the unsynchronized measurements returned by a sensor positioned over a circuit breaker body.

FIG. 1 depicts a block diagram of components found in a measurement system in an exemplary embodiment. The system 100 includes sensors 102 for measuring samples of the magnetic field strength for magnetic fields generated by electrical circuits. The sensors 102 may be, for example, magnetometers, such as three-axis-flux-gate magnetometers. The sensors 102 may take different forms, but the sensors 102, regardless of type, may measure the magnetic field strength. The sensors 102 may be positioned over circuit breakers or in proximity to the circuit breakers to measure the magnetic field strength for the circuits associated with the circuit breakers. In some embodiments, the sensors 102 are positioned over the front face of the circuit breakers. The sensors 102 may be electrically and mechanically coupled to a hub 104. The hub 104 may provide a connection to a device 106 with a processor 108, such as a computer system, a tablet, a smart phone, or other suitable processing device. The hub 104 may be wired to the device 106 to facilitate communications. Alternatively, the hub 104 may have a modem or other interface with a wireless device to wirelessly communicate information between the sensor and the device 106, wherein various wireless protocols may be utilized such as WiFi, Bluetooth, LTE, NFC, ZigBee, Z-Wave, or other long- or short-distance communication system. The device 106 may be located locally or remotely. The hub 104 may, in some embodiments, include the device 106 and the processor 108. The hub 104 may be connected to a power source or may be battery powered. In some embodiments, no hub 104 is employed, and the sensors 102 may be connected directly to the device 106.

Estimation from Unsynchronized Samples

In some exemplary embodiments described herein, readily available low-cost mass-produced digital sensors, such as digital three-axis-flux-gate magnetometers, are used to measure electromagnetic fields and thus estimate current for electric circuits. This variety of sensor is conventionally used in navigation applications, for which a static field from the Earth is measured and is not used in determining electric current. It is particularly challenging to utilize these low-cost sensors for determining AEC. The sensors return values that are unsynchronized to a rapidly changing field, such that a peak-to-peak amplitude of a cycle of the magnetic field at the alternation frequency (i.e., the magnetic field strength) must be computed by estimating it from the unsynchronized sample values returned by the sensor.

The exemplary embodiment makes an estimate of the amplitude of the current at or around the frequency of the AEC. For most electric distribution systems connected to a national grid or to local power generation, the frequency of the alternating current is 50 Hertz or 60 Hertz. Other frequencies can also be utilized for amplitude estimation, for example in conjunction with larger electrical loads that consume significant energy at harmonic frequencies. For traditional amplitude estimation techniques, samples of the electric or corresponding magnetic field must be no farther apart in time than half of the period of the line frequency. This interval is known as the Nyquist interval. Applying this to a 50 Hertz and a 60 Hertz line frequency, the system must use a measurement sample interval shorter than ¹/₁₀₀th of a second and ¹/₁₂₀th of a second, respectively. Typically, a small fraction of the Nyquist interval must be utilized to determine peak amplitude of the electromagnetic field with some accuracy, further reducing the maximum sample interval that must be achieved by the sensor.

Long Sampling Intervals

A complication that arises due to the use of low-cost, consumer-grade magnetic sensors is that the sensors do not offer a sufficiently short sampling interval. The sample interval is typically longer than the Nyquist interval corresponding to the frequency of alternation of the field being measured. This is a limitation of the sensors as they were intended to be used to measure static or slowly varying magnetic fields, not rapidly changing fields in magnetodynamic applications. Also motivating the use of longer sampling intervals is the desire to minimize the number of data samples processed per time interval by a system, which allows for slower and less expensive processors for the system. Longer sampling intervals also enable a data bus with a certain data bandwidth to service more sensors before reaching its maximum capacity. This slower sampling causes conventional amplitude estimators, such as those based on an FFT, to fail and provide erroneous estimates of the field strength. The exemplary embodiment that follows addresses this problem by utilizing samples of magnetic field measured by a magnetometer at time intervals longer than the Nyquist interval while accurately estimating the amplitude of the magnetic field with high accuracy. Thus, a set of data samples having the longer sample interval may be used to obtain an accurate estimate of the amplitude of the AEF generated by AEC passing through a given circuit breaker.

A least-squares technique can be used to estimate the amplitude of the field at the alternation frequency for sensors with long sample time intervals. Assuming the AEF sensor data consists of a sum of cosines with amplitudes $\alpha_k$, frequencies $\omega_k$ and phases $\varphi_k$, and that the data are discrete-time samples measured at a periodic interval of T seconds, the data samples may be modeled mathematically using $$x[n] = \sum_{k=1}^{K} a_k \cos(\omega_k nT - \varphi_k); n = 0, 1, 2, \ldots, N-1 \tag{1}$$

The frequencies $\omega_k$ are known and the number of samples N is at least twice the number of frequencies K for which AEF amplitudes will be estimated, i.e., N>=2K. Replacing the cosine of a sum of angles with a sum of a sine and cosine term yields:

$$x[n] = \sum_{k=1}^{K} b_k \text{COS}(\Omega_k n) + d_k \text{SIN}(\Omega_k n); n = 0, 1, 2, \ldots, N-1 \quad (2)$$

where $\Omega_k = \omega_k T$, $b_k = a_k \cos(\varphi_k)$ and $d_k = a_k \sin(\varphi_k)$. Rewriting (2) in matrix form, $$x = \begin{bmatrix} x[0] \\ x[1] \\ x[2] \\ \vdots \\ x[N-1] \end{bmatrix},$$

and $$c_k = \begin{bmatrix} \cos(0) \\ \cos(\Omega_k) \\ \cos(2\Omega_k) \\ \vdots \\ \cos((N-1)\Omega_k) \end{bmatrix}, s_k = \begin{bmatrix} \sin(0) \\ \sin(\Omega_k) \\ \sin(2\Omega_k) \\ \vdots \\ \sin((N-1)\Omega_k) \end{bmatrix},$$

such that (2) becomes $$x = \sum_{k=1}^{K} b_k c_k + d_k s_k \quad (3)$$

Vectors and matrices are expressed using lowercase and uppercase bold text, respectively. One can express (3) in matrix form as $$x = Hf \quad (4)$$

where H is the N-by-2K matrix $$H = [c_1 s_1 c_2 s_2 \ldots c_k s_k]$$

which consists entirely of known values, since frequencies $\Omega_k$ are known, and f is the 2K-by-1 vector of unknown parameters $$f = \begin{bmatrix} b_1 \\ d_1 \\ b_2 \\ d_2 \\ \vdots \\ b_K \\ d_K \end{bmatrix}$$

To solve (4), pre-multiply both sides by the matrix transpose $H^T$ $$H^T x = H^T H f$$

and compute the explicit matrix inverse $$f = (H^T H)^{-1} H^T x \quad (5)$$

Solving (5) for f, one can determine $a_k = \sqrt{b_k^2 + d_k^2}$.

From equation (5), the exemplary embodiment may determine the peak-to-peak amplitude for the alternation frequencies of interest, e.g., 50 Hertz and 60 Hertz. Thus, the AEC amplitude is calculated as discussed above relative to step 408 of FIG. 4. The solution demands the calculation of the inverse of a 2K-by-2K matrix $H^T H$ which must be used for each estimate. When estimating the amplitude at two alternation frequencies of interest, K=2 and therefore $H^T H$ is a 4×4 matrix, the size of which is independent of N, the number of consecutive samples recorded.

Figure 5:
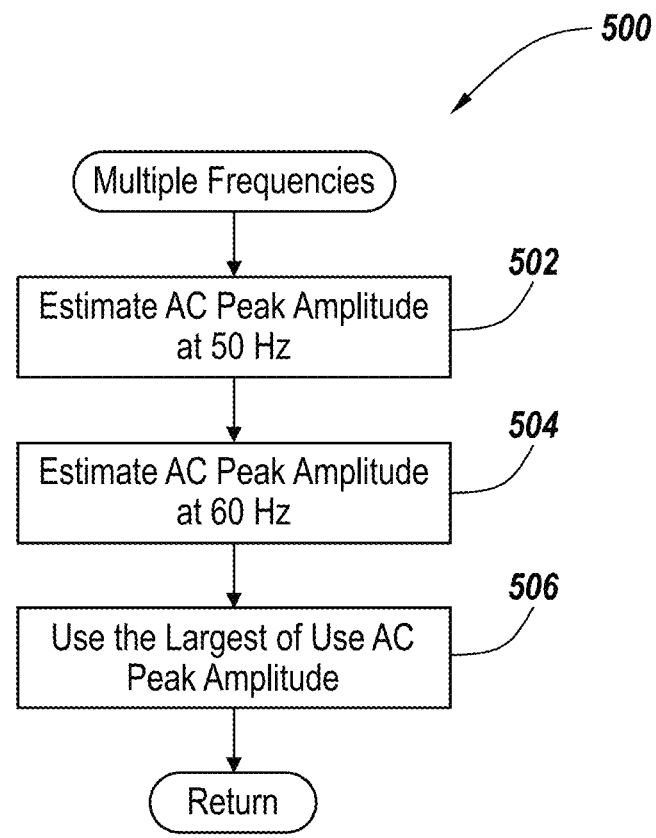
FIG. 5 is a flowchart illustrating steps performed to realize calculations at multiple possible alternating current frequencies.

The exemplary embodiment makes these calculations for both 50 Hertz and 60 Hertz and assumes that the correct alternation frequency is the frequency that provides the highest amplitude estimate. Thus as shown in FIG. 5, the exemplary embodiment estimates the AEC amplitude at 50 Hertz (step 502) and also at 60 Hertz (step 504). The alternation frequency corresponding to the larger of the two amplitudes is chosen and used (step 506). The exemplary embodiment then has a value for the alternation frequency for the monitored electric system.

Timing Calibration

Figure 6A:
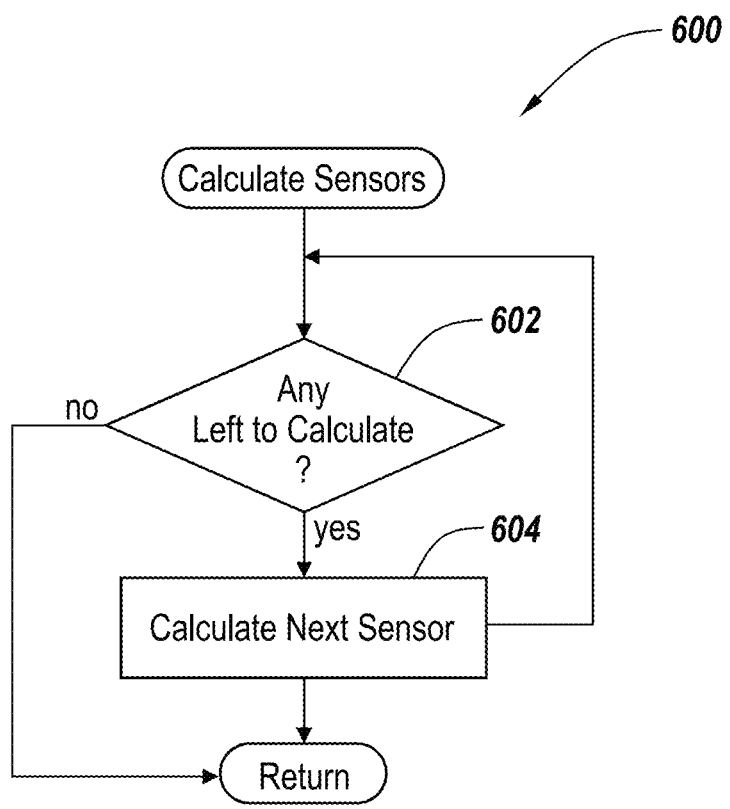
FIG. 6A is a flowchart illustrating the steps performed to calibrate the sensors in the system.

Another complication associated with the use of consumer-grade sensors is that the sampling intervals for each sensor may vary, and the sampling interval for any single sensor varies significantly from its nominal specified reference value. In order to perform accurate estimation of AEF amplitude, the exemplary embodiment must estimate with some degree of accuracy the actual sampling interval for each sensor. These sample intervals come into play in precomputation of $s_k$ and $c_k$ which are part of matrix H and ultimately form the values used in computing the matrix inverse, $(H^T H)^{-1}$. In order to compute this critical matrix with accuracy, the exemplary embodiment performs a timing calibration. This calibration may be performed when the system is powered up, at periodic intervals or upon request of the user or by the application. As shown in flowchart 600 of FIG. 6A, the calibration process iterates through each of the sensors. Initially a check is made whether there are any sensors left to calibrate (step 602). If there are no sensors left to calibrate, the process stops. However, if there are sensors left to calibrate, the calibration proceeds with the next sensor (step 604).

Figure 6B:
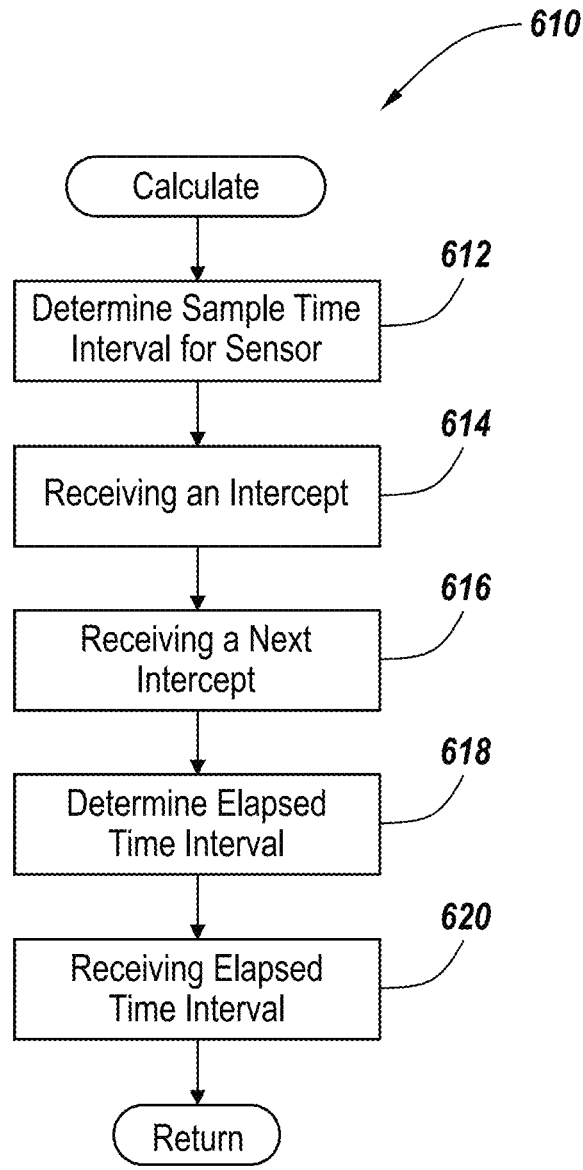
FIG. 6B is a flowchart illustrating the steps that are performed for sample time calibration of an individual sensor.

The timing calibration of each sensor is performed as shown in FIG. 6B. The sample time interval for the sensor may be determined by enabling the sensor (step 612), receiving a first interrupt generated by the sensor (step 614), noting the value of a timer, receiving the next interrupt generated by the sensor (step 616), then determining (step 618) and recording (step 620) the elapsed time interval specified by the timer. Several estimates of the elapsed time may be averaged to provide an accurate estimate of the sensor sample time. The sample time interval is recorded and used as the value for the sensor timing until the calibration is performed again.

This approach allows the sample time interval to be updated on an ongoing basis and to provide an accurate current sample time interval for the sensors, which may change over time and with changing conditions, such as temperature. This calibration allows for individual variations in sample intervals among the sensors. The sample time variation among sensors may be quite large, and may vary by 20% or more from the nominal value for low-cost sensor devices. The sample time variation makes a small difference in magneto-static applications, while a rapidly varying field in a magneto-dynamic application was not anticipated by sensor manufacturers and presents another significant obstacle when used for the present application. Such variation can result in significant errors in estimates if the variation is not taken into account. Each time the sample time is estimated for a sensor, a new value for the estimation matrices H and $(H^T H)^{-1}$ must be computed.

In support of these calculations, the device 106 (FIG. 1) may perform calibration of the sensors 102, including measurement of the sample time of an individual sensor instead of relying on published nominal values of the sample time. These operations may be performed by the processor 108 in some embodiments. The device 106 may process the sensor data via the processor 108 or other means to account for long sample time intervals and may compensate for smoothing performed by sensors. The device 106 may perform calculations to estimate the AEC amplitude from the sensor data.

System Architecture

When the device 106 includes a processor 108, the processor 108 may take many different forms. For example, the processor 108 may be a microcontroller or a microprocessor having one or more cores. The processor 108 also may be a field programmable gate array (FPGA), an ASIC, electrical circuitry or another type of processing logic. The processor 106 is intended to refer to a processing resource like those described above and may include multiple resources, such as multiple microprocessors in the cloud. The device 106 may interface with storage 110. The storage 110 may include any of a number of different types of storage devices, including optical storage, magnetic storage, solid state storage, read only memory (ROM), random access memory (RAM) and other varieties thereof. The storage 110 may include devices for accommodating non-transitory computer-readable storage medium that, for example, hold instructions that are executed by the processor 108 to perform the functionality described herein. The device 106 may interface with a display 112. The display 112 may take a number of different forms. The display 112 and the storage 110 need not be separate devices but rather may be integrated with the device 106.

Figure 2:
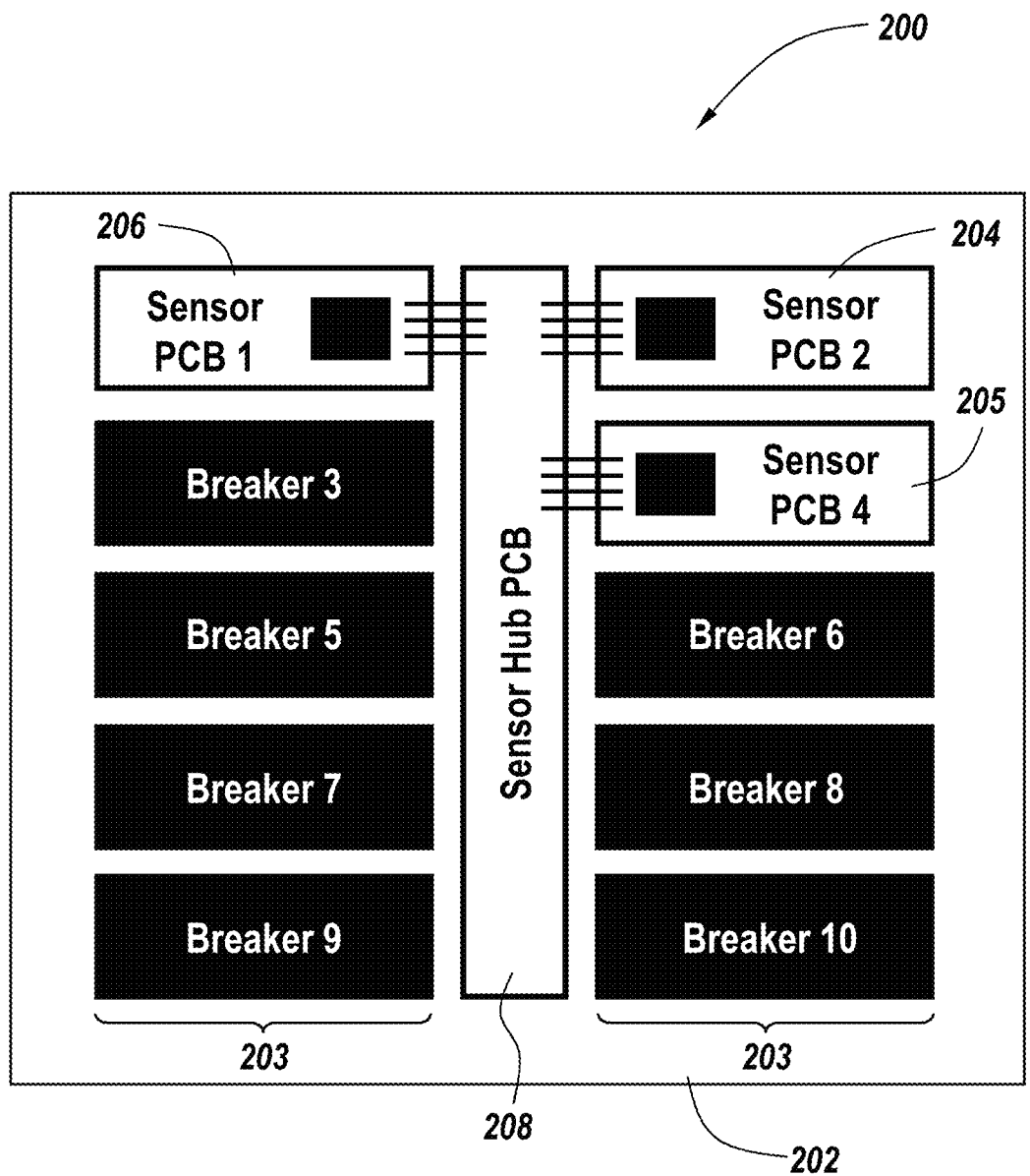
FIG. 2 shows an exemplary configuration of an electrical panel having columns of circuit breakers.

FIG. 2 depicts an example of a layout of an electrical panel 200 to which components of the system have been applied. The electrical panel 200 depicted in FIG. 2 includes an electrical panel cover 202 and two columns 203 of circuit breakers. This depiction of electrical panel 200 is intended to be merely exemplary and not limiting. Those skilled in the art will appreciate that the electrical panel 200 may be organized in alternative configurations which include a different number of columns, rows and/or circuit breakers.

Sensors 204, 205 and 206 are positioned over respective circuit breakers and are connected to a sensor hub 208. This enables monitoring of the circuits associated with the circuit breakers that have sensors. The exemplary embodiment employs a modular approach which allows the user to choose what circuits the user wishes to monitor and to attach sensors for just those circuits. Sensors 204 and 205 are positioned in a first column, whereas sensor 206 is positioned in the second column. The hub 208 is positioned on the electrical panel cover 202 laterally between the columns 203. The hub 208 provides electrical and mechanical connections with the sensors 204, 205 and 206.

Figure 3A:
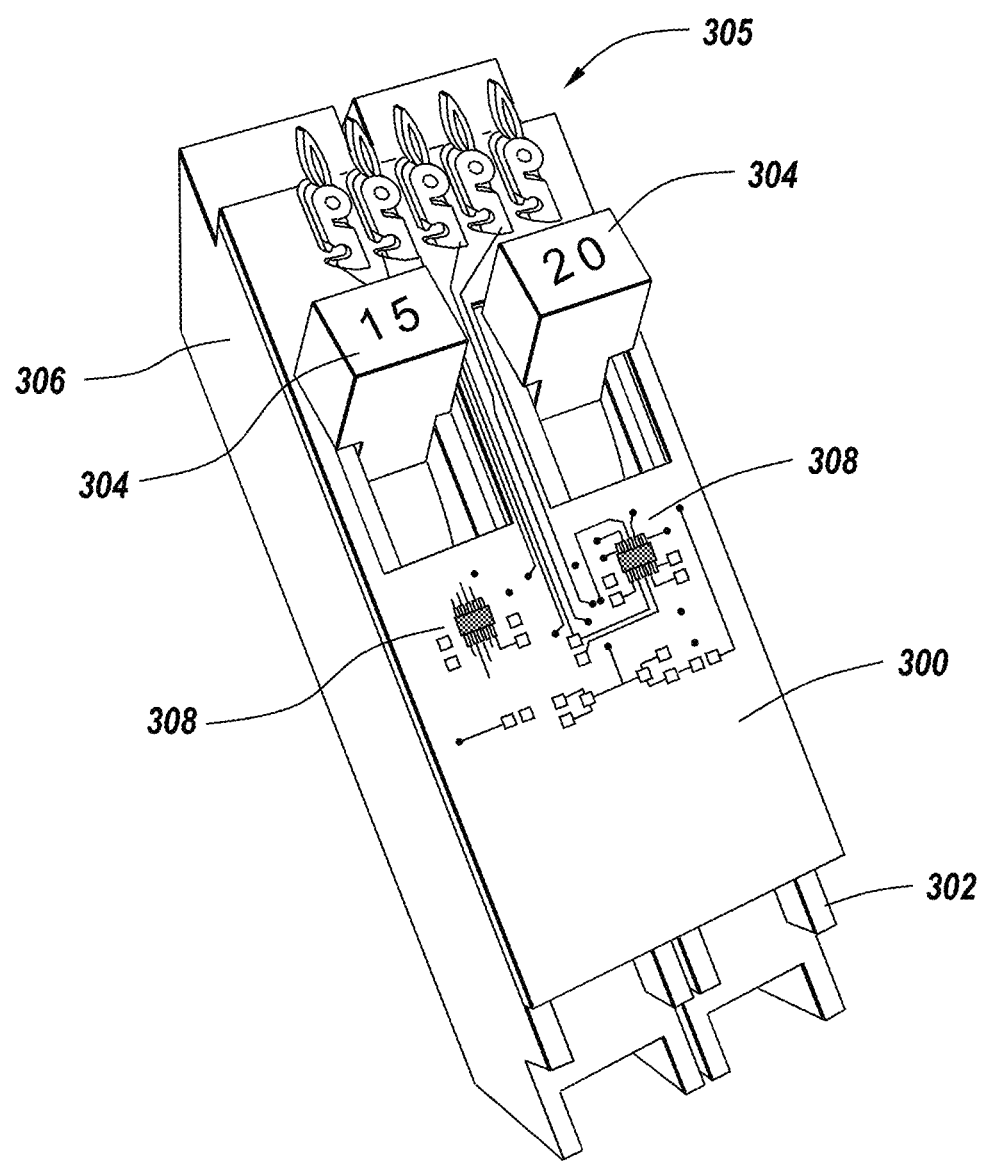
FIG. 3A depicts an example of a circuit breaker having two actuator levers with a circuit board positioned over the actuator levers that includes sensors.

As is shown in FIG. 3A, the sensors 308 may be formed on a circuit board 300 that is positioned over the front face of the circuit breaker body 302. The circuit breaker 306 depicted in FIG. 3 includes two actuator levers 304. The actuator levers 304 may be manually actuated or tripped in response to events, such as a power surge to open the circuit. Normally the actuator levers 304 are in a closed position that closes the associated circuits. The circuit board 300 may include electrical connectors 305 for connecting the circuit board to the hub 208 (FIG. 2).

The circuit board 300 may include openings to accommodate the actuating levers 304. Openings may also be provided to accommodate reset switch buttons. The circuit board 300 may include sensors 308 as described above.

Figure 3B:
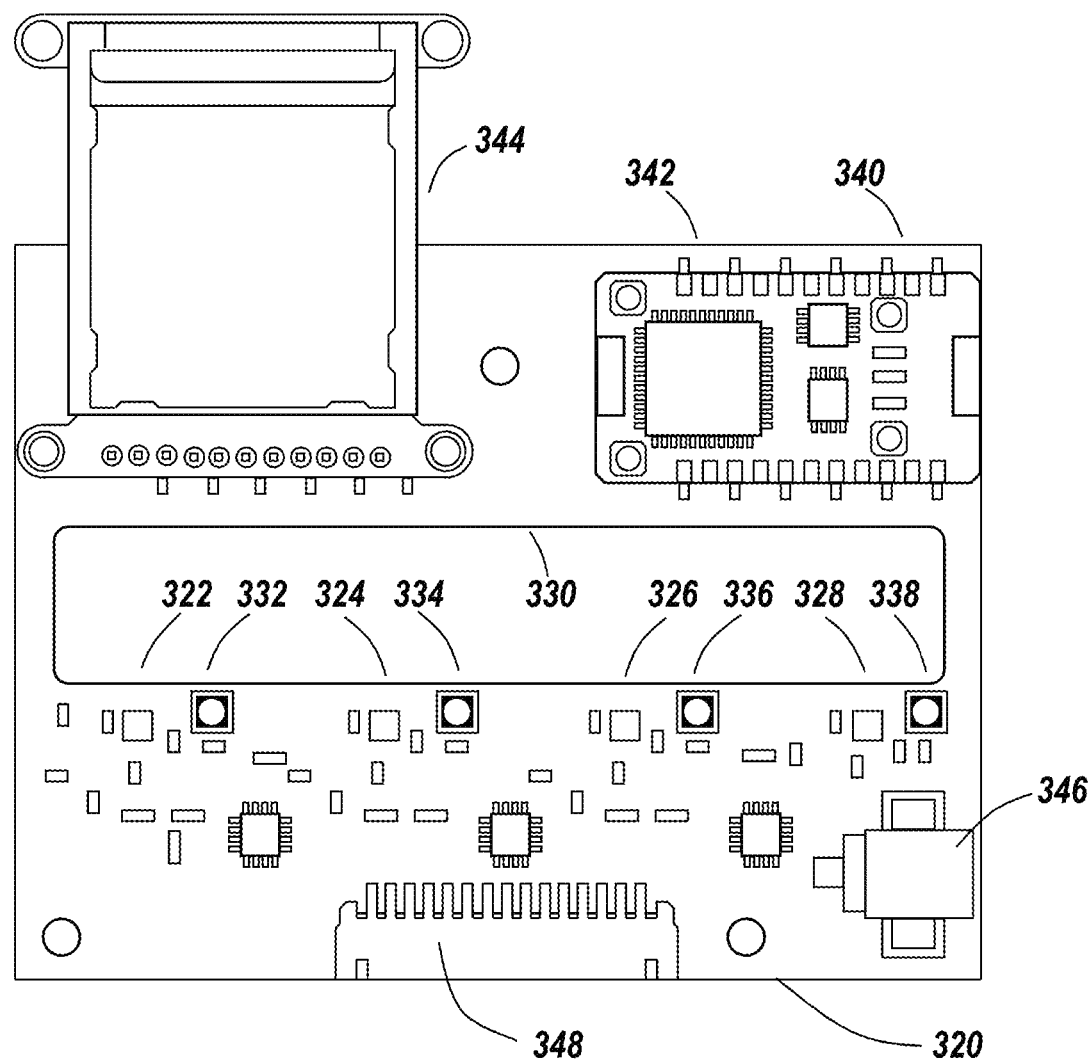
FIG. 3B depicts an exemplary configuration of a circuit board positioned a four adjacent circuit breakers having four actuator levers that includes four magnetometers, a processor, and a display.

FIG. 3B shows another configuration of a circuit board 320, upon which multiple sensors 322, 324, 326 and 328 may be formed. In this exemplary configuration, the circuit board contains four LEDs 332, 334, 336 and 338, adjacent to each of the four sensors. It is configured such that the cutout 330 is positioned over the front face of four consecutive circuit breaker bodies. This configuration includes a processor 340 that includes an integrated WiFi and Bluetooth communications unit 342, a display 344, a power jack 346 and a connector 348 to electrically connect to a hub 208 (FIG. 2).

Figure 4:
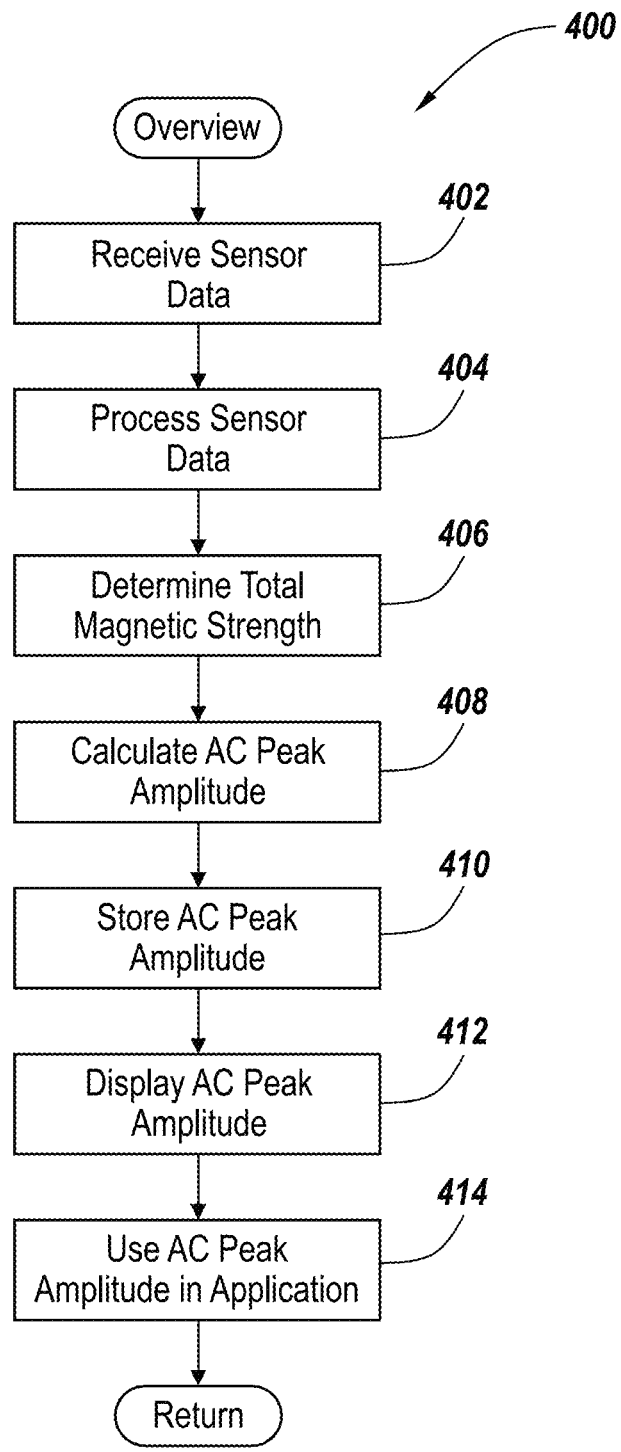
FIG. 4 is a flowchart providing an overview providing steps performed in an exemplary embodiment.

FIG. 4 depicts a flowchart that provides an overview of steps performed in processing and using the sensor data from the sensors in the exemplary embodiment described herein. This flowchart represents the steps taken for a single sensor. These steps are performed for each sensor when multiple sensors are used. Initially, sensor data is received for a specified number of data samples (step 402). The data samples are taken at regular, calibrated points in time. In some alternative embodiments, the intervals over which data samples are gathered may vary. The sensor data is then processed (step 404). The number of samples processed together may be configurable. The processing of the sensor data may compensate for undesirable impacts such as crosstalk and smoothing as will be described below. In addition, other processing may be performed to prepare the sensor data for further analysis. Details of this processing are provided below. Based upon the processed sensor data, the AEF strength is determined from the group of samples that have been processed (step 406). The AEF strength is then used to calculate the AEC amplitude (step 408). As will be described in more detail below, once the AEF strength is known, or a quantity with known relation to it, the AEC amplitude may be determined.

The calculated AEC amplitude may be used in a variety of ways. First, the value of the AEC amplitude may be stored in a storage, such as the storage 110 depicted in FIG. 1 (step 410). The system may store these AEC amplitude values for respective circuit breakers on an ongoing basis. The AEC amplitude may also be displayed on a display 112 or otherwise output for review by a user (step 412). The AEC amplitude may also be used in an application program running on a device, such as a smart phone, a personal computer or the like (step 414). For example, an application may plot a graph of the sequential AEC amplitudes or may display warnings or values to a user. The AEF or AEC amplitude may be communicated to a remote display or remote computing device for viewing or for further computation by means of a wireless communications link, such as LTE, 5G, WiFi, Bluetooth, NFC, ZigBee, Z-Wave or other short- or long-distance communication system, or by means of a wired communications link, such as Ethernet, USB, serial, JTAG, PCI, Internet or other serial, parallel, packet-based or circuit-switched communication system.

Components suitable for realizing the sensors, hub and device are described in more detail in co-pending application entitled, "Electromechanical System for Dynamic Electromagnetic Measurement of Alternating Electric Current," filed on even date herewith and incorporated in its entirety by reference herein.

Sample Smoothing

Figure 7:
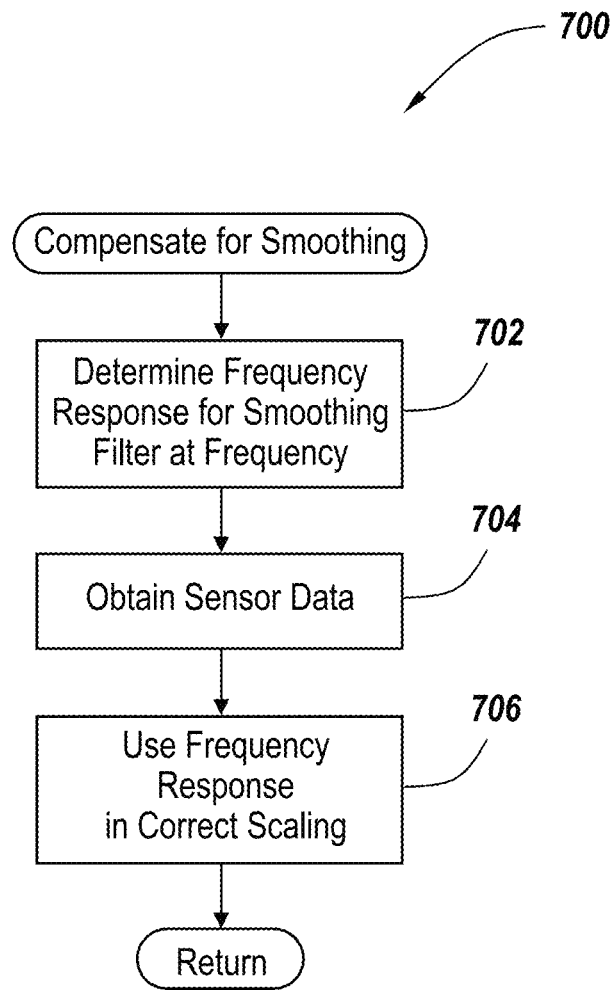
FIG. 7 is a flowchart of the steps that are performed to compensate for sample smoothing.

The use of low-cost, consumer-grade magnetic sensors requires some processing of the sensor data as discussed above relative to step 404 of FIG. 4. One of those processing steps is to compensate for a smoothing operation, which is either built into the sensor device or performed as a separate step in the processor. The smoothing operation is especially useful for a low-cost sensor, since the smoothing operation reduces measurement noise and leads to greater accuracy and a lower noise floor for the sensor measurement. If the smoothing is performed in conjunction with a magnetic field that is static or slowly varying, the values returned by the sensor are correct. For the exemplary embodiment, the magnetic field is continuously changing and the smoothing operation renders the sensor value inaccurate for all time steps by an amount that depends on several factors, including the frequency of the AEF and the precise sample time of the sensor, in nonlinear fashion. The exemplary embodiments may compensate for the smoothing of the samples at the alternation frequency of the AEF by computing a compensation coefficient based on the smoothing parameters. FIG. 7 provides a flow chart 700 of the steps that are performed to compensate for the smoothing. The formula describing the frequency response of a uniform, moving-average type of smoothing operation typically performed for a magneto-static sensor is:

$$H(\omega)=(1/L)(1-e^{-j\omega L})/(1-e^{-j\omega})$$

where L is the number of samples utilized for the smoothing, $\omega=2\pi f$ is the radian frequency and j is the square-root of $-1$ and represents the imaginary component of complex-valued phasor notation. Performing the analysis at f=60 Hz alternation frequency, and with an analog-to-digital converter (ADC) rate of 640 Hz, the table below shows values of the scaling factor required to compensate sensor measurements of a magneto-dynamic field and the example improvement in noise level that results, for the example NXP MAG3110 sensor referenced earlier.

| Smoothing Samples, L | Effective Sensor Sample Interval (mS) | Noise Level (µT rms) | Scaling Factor, H(ω) |
|---|---|---|---|
| 16 | 25 | 0.4 | 0.9092 |
| 32 | 50 | 0.35 | 0.6652 |
| 64 | 100 | 0.3 | 0.0471 |
| 128 | 200 | 0.25 | 0.0466 |

The inaccuracy in the measurement is therefore off by a scale factor that depends on the alternation frequency and the number of samples of smoothing, as shown in the table, where the number of samples changes the frequency response of the smoothing operation. The value of the scale factor is based on the spectral response of the smoothing filter used by the sensor computed at the alternation frequency of the power line, hence an estimate of the frequency as shown in the flow chart of FIG. 5 is needed. Also required is the measured sample time of the sensor. All of these quantities must be known in order to remove the inaccuracy imposed by smoothing. A scaling of the returned value therefore occurs when measurements are made in a magneto-dynamic condition.

With reference to FIG. 7, the frequency response to the smoothing filter at the specified frequency of 50 Hertz or 60 Hertz is to be determined (step 702) according to the aforementioned compensation formula. The frequency response may be used to determine the proper compensation that is required. Once the frequency response to the smoothing filter at the specified frequency is determined in step 702, the sensor data is obtained (step 704). The frequency response may be then used to correct the scaling and thus compensate for the smoothing (step 706) in FIG. 7.

Leakage

The exemplary embodiments also correct for the presence of leakage, which is an amplitude distortion reported by an electromagnetic sensor due to the presence of other independent electric circuits within a circuit breaker electrical panel. The summation of the fields radiated from other nearby circuit breakers impacts the measurement produced by a sensor at a location even when it is in close proximity to a particular circuit breaker. The measurement made by a sensor in close proximity to one circuit breaker will report a value that partly reflects the field from other nearby circuit breakers, thereby imparting an error in the value reported. Physical isolation of the sensor from the electromagnetic field generated by other nearby circuit breakers is not present in electrical panels and is highly impractical. Therefore, numerical estimation and computational elimination of leakage is highly desired. The device 106 (FIG. 1) may account for cross-talk generated by overlapping magnetic fields from adjacent circuit breakers.

Figure 8:
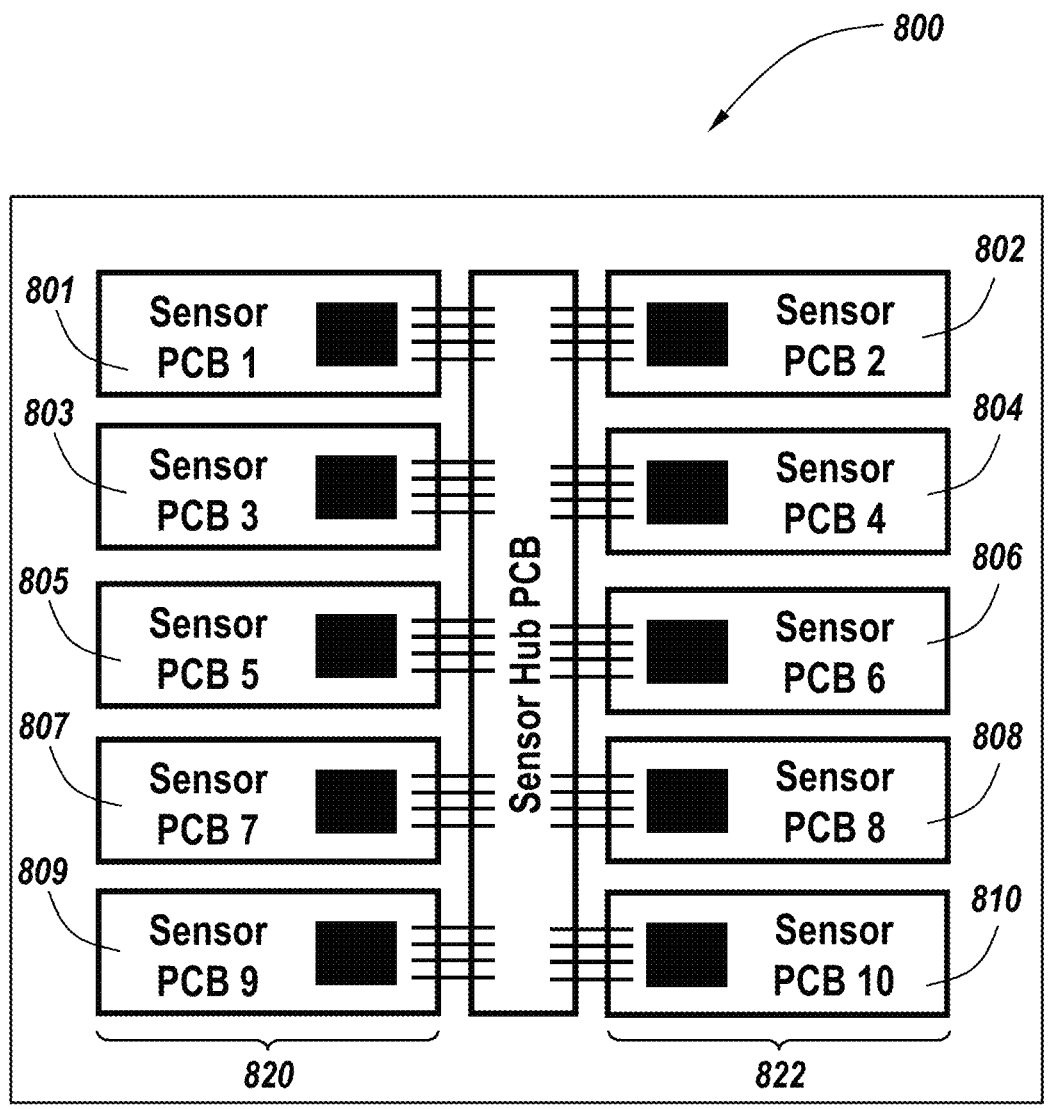
FIG. 8 depicts an electrical panel with circuit breakers and fully populated with co-located sensors.

In multi-source, multi-sensor measurement systems wherein distant radiating sources impart non-negligible contributions to a local sensor measurement, source leakage may be identified and reduced, enabling accurate measurements of a local source. An exemplary embodiment for multi-circuit measurement incorporates automatic leakage assessment based on a novel system involving predetermined current consumption with computational reduction of its impact based on a set of sensor measurements. With reference to FIG. 8, assume an N×2 array of circuit breakers 800 with co-located sensors 801-810, where each sensor sits atop a circuit breaker, and each circuit breaker generates an electromagnetic field when current passes through it. The circuit breakers function as an array of electromagnetic sources. It is desired to estimate and remove the portion of the fields generated by distant circuit breakers that influence the measurement returned by a sensor atop a local circuit breaker, so that the measurement better estimates the electromagnetic field generated exclusively by the local circuit breaker. Removal of the impact of distant sources on the local measurement is known as leakage reduction.

A conventional technique to reduce leakage relies on adding shielding or other physical barriers to the measurement environment that impose significant attenuation of the electromagnetic fields from distant sources as they propagate toward a local sensor. Shielding can provide a significant reduction in leakage, but requires significant physical changes to the system. Shielding may be unwieldy or impractical, where the desired degree of leakage reduction demands physically large or thick metal plates to be attached and grounded in small regions that are typical of an electrical panel.

An alternative to conventional shielding includes a computational means of leakage reduction in a measurement array, wherein leakage continues to occur in the physical measurement system, but is subsequently reduced after the measurements including leakage are obtained. A computational approach to the electromagnetic measurement system is described herein. Let $f(P_i,P_j)$ represent the attenuation (or "path loss") experienced by an electromagnetic field as it propagates from source location $P_i$ to measurement location $P_j$, where each location may be expressed as a 2-D or 3-D Cartesian coordinate. Example mathematical expressions for electromagnetic path loss include inverse distance, $$f(P_i, P_j) = \frac{\alpha}{|P_i - P_j|}$$

and exponential decay, $$f(P_i, P_j) = \exp(-\alpha|P_i - P_j|).$$

where $\alpha$ is a scale factor determined by a calibration step. $s_k$ is the electromagnetic field strength generated by the source at location $P_k$. Given a sensor located at $P_k$, the measurement $m_k$ from the sensor includes the locally-generated magnetic field $s_k$ plus the sum of a portion of the fields generated by other distant sources $s_i$, $i \neq k$. The portions are established by the attenuation $f(P_i, P_k)$ of the field from each distant source, and these additional undesired terms are referred to as leakage in the measurement. Depending on the type of electromagnetic field being sensed and the materials used in the electrical panel, leakage may have a significant impact on sensor measurements. For example, electric fields may propagate with less attenuation than magnetic fields for a given electrical panel, and thus, the degree of leakage from a distant source on a local sensor measurement may be greater for electric field sensors versus magnetic field sensors.

Without loss of generality, one can assume sensor locations are arranged in an N×2 physical grid 820, 822 on top of circuit breakers with 2N number of distinct sensor locations. Sensor measurements $m_k$ can be modeled as:

$$\begin{aligned}
m_k = s_1 & * f(P_1, P_k) \quad \text{(leakage from source at } P_1 \text{ to sensor at } P_k\text{)} \\
& \ldots \\
+ s_{N-1} & * f(P_{N-1}, P_k) \\
+ s_N & * f(P_N, P_k) \quad \text{(leakage from source at } P_N \text{ to sensor at } P_k\text{)} \\
+ s_{N+1} & * f(P_{N+1}, P_k) \\
& \ldots \\
+ s_{2N} & * f(P_{2N}, P_k). \quad \text{(leakage from source at } P_{2N} \text{ to sensor at } P_k\text{)}
\end{aligned}$$

$m_k$ is a scalar value representing the electromagnetic field as measured at location $P_k$ and includes leakage terms from distant sources.

Figure 9A:
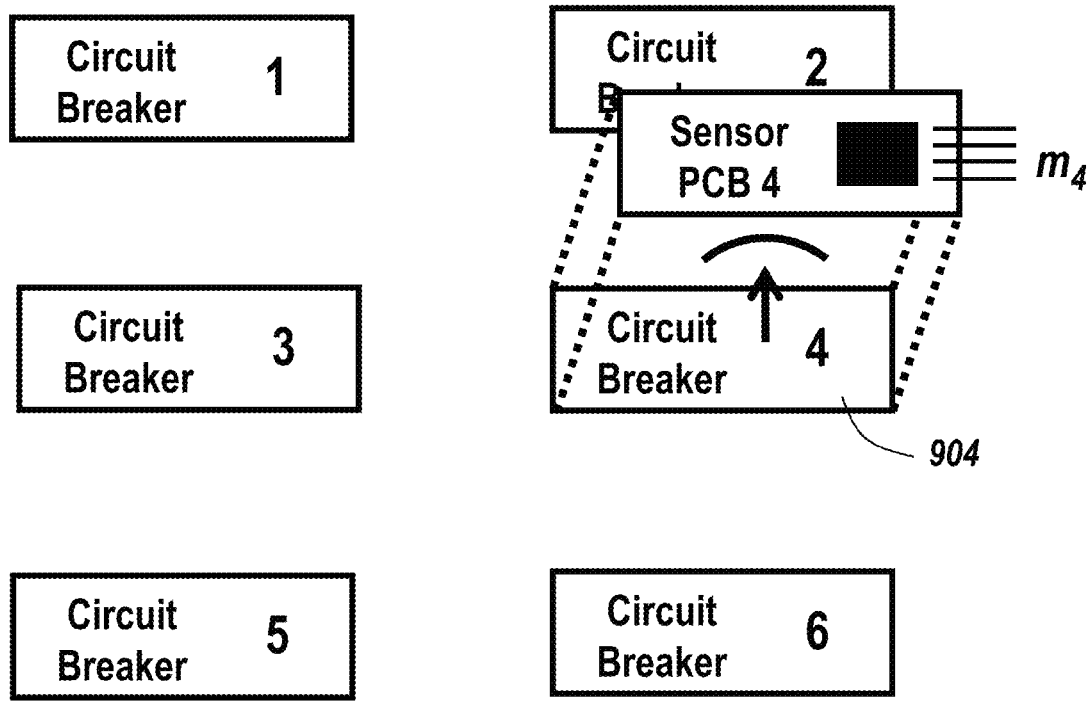
FIG. 9A depicts an electrical panel with one circuit breaker that has current passing through it and one co-located sensor.
Figure 9B:
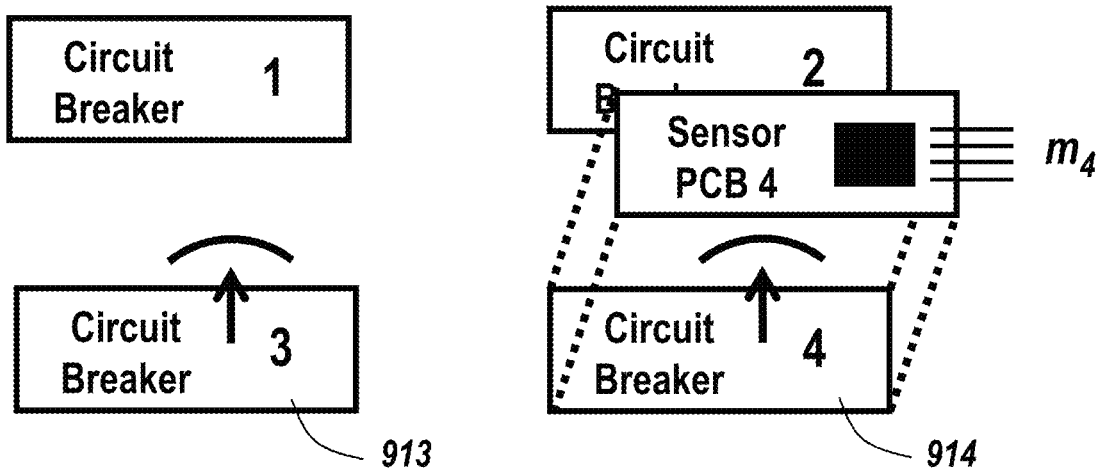
FIG. 9B depicts an electrical panel with two circuit breakers that have current passing through them and one co-located sensor.
Figure 9C:
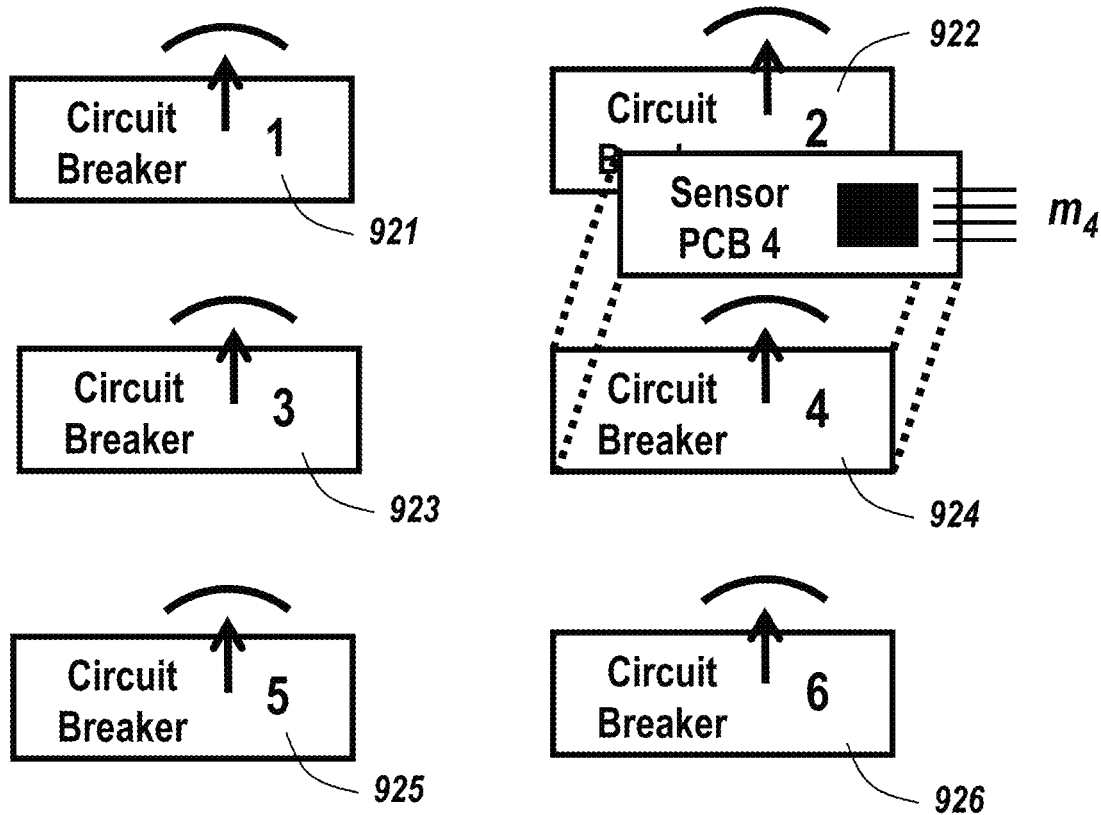
FIG. 9C depicts an electrical panel with six circuit breakers that have current passing through them and one co-located sensor.

To illustrate how the formula $m_k$ is utilized, refer to FIG. 9A. This figure depicts an example with six circuit breakers and one sensor, wherein only circuit breaker 904 has current flowing through it and thereby generates an electromagnetic field. In FIG. 9A, only one term is included in $m_4$ and leakage does not occur. In FIG. 9B, two circuit breakers 913-914 have current flowing through them and generate a field that induces measurement leakage into sensor measurement $m_4$. Finally, in FIG. 9C, six circuit breakers 921-926 have current flowing through them and the measurement leakage $m_4$ now contains multiple leakage terms.

By rearranging the formula for $m_k$ above into matrix form, a 2N×1 column vector S containing the estimated electromagnetic field strengths $s_k$ generated by sources at each of 2N locations $P_k$ may be represented as $$S = [s_1 \quad \text{(field strength generated by source at } P_1\text{)}$$
$$s_2$$
$$\ldots$$
$$s_{N-1}$$
$$s_N \quad \text{(field strength generated by source at } P_N\text{)}$$
$$s_{N+1}$$
$$\ldots$$
$$s_{2N}]. \quad \text{(field strength generated by source at } P_{2N}\text{)}$$

$F_k$ is the 1×2N row vector, $$F_k = [f(P_1, P_k) \ldots f(P_{N-1}, P_k) f(P_N, P_k) f(P_{N+1}, P_k) f(P_{2N}, P_k)]$$

which records the path loss from all distant sources to a sensor located at $P_k$. There are 2N number of such row vectors $F_k$, one for each sensor location $P_k$ of interest. Now, one can see that $$m_k = F_k * S$$

which is an inner product of vectors. Just as there were 2N number of path loss vectors $F_k$, there are 2N number of scalar measurements $m_k$, since there are 2N unique sensor locations $P_k$.

Now F can be delivered to be a square matrix of size 2N×2N matrix and containing all 2N row vectors $F_k$:

$$F = [F_1 \quad \text{(row vector of path losses to sensor at } P_1\text{)}$$
$$\ldots$$
$$F_{N-1}$$
$$F_N \quad \text{(row vector of path losses to sensor at } P_N\text{)}$$
$$F_{N+1}$$
$$\ldots$$
$$F_{2N}]. \quad \text{(Row vector of path losses to sensor at } P_{2N}\text{)}$$

This allows one to express M as:

$$M = F * S,$$

a matrix-vector product, where M is a 2N×1 column vector containing measurements $m_k$ for the N×2 array of sensors, with sensor locations rearranged in linear order as in F, i.e., $$M = [m_1 \ldots m_{N-1} m_N m_{N+1} \ldots m_{2N}]^T$$

where superscript T denotes a vector transpose. The aim is to determine S, the set of all local sensor measurements with no leakage from distant sources. The solution S to the equation M=F*S may be found as follows:

measure M, the 2N sensor measurements taken at each source location $P_i$, in the presence of leakage from distant sources determine F, based on a selected path-loss function; and compute S, the 2N electromagnetic field strengths generated exclusively by the local source at each location $P_k$.

To understand computational problem size, for this problem given a 20×2 grid of circuit breakers fully equipped with sensors, F is a 40×40 matrix, while for a 40×2 grid of circuit breakers, F is an 80×80 matrix. Conceptually, given M=F*S, with M and F known, we compute S=inv(F)*M using a matrix inverse operation. F is square and Hermitian (symmetric), so an explicit matrix inverse could be performed using efficient techniques such as Cholesky or LDLT factorization, the latter decomposing F into the product of matrices L*D*L', such that the system of matrices becomes $$M = L*D*L'*S.$$

In this case, the solution S may be obtained using forward- and back-substitution steps which are efficient matrix operations. LDLT also removes the need for square-root operations which a Cholesky-based solution demands. The symmetric nature of the decomposition also allows for reduced storage size of the matrices as compared to a general matrix decomposition such as LU.

Since F may be precomputed from path loss, the Cholesky or LDLT decomposition may be performed once during initialization prior to operation of the measurement system. Thereafter, if path losses vary over time, the decomposition may be updated efficiently without performing an entire LDLT decomposition. A rank-one update procedure may be performed periodically in order to update the LDLT decomposition whenever new propagation loss information is obtained, such as when values of scale factor α are updated by a calibration step.

Determining path loss function $F_k$ is useful in leakage reduction and may involve a calibration step to determine a scale factor α. Calibration may be performed manually, by applying and removing a known load to a circuit at a known time, and from the pair of sensor measurements before and after the change in load, determining the scale factor. Calibration may also be performed automatically, eliminating involvement by users of the measurement system.

Figure 10:
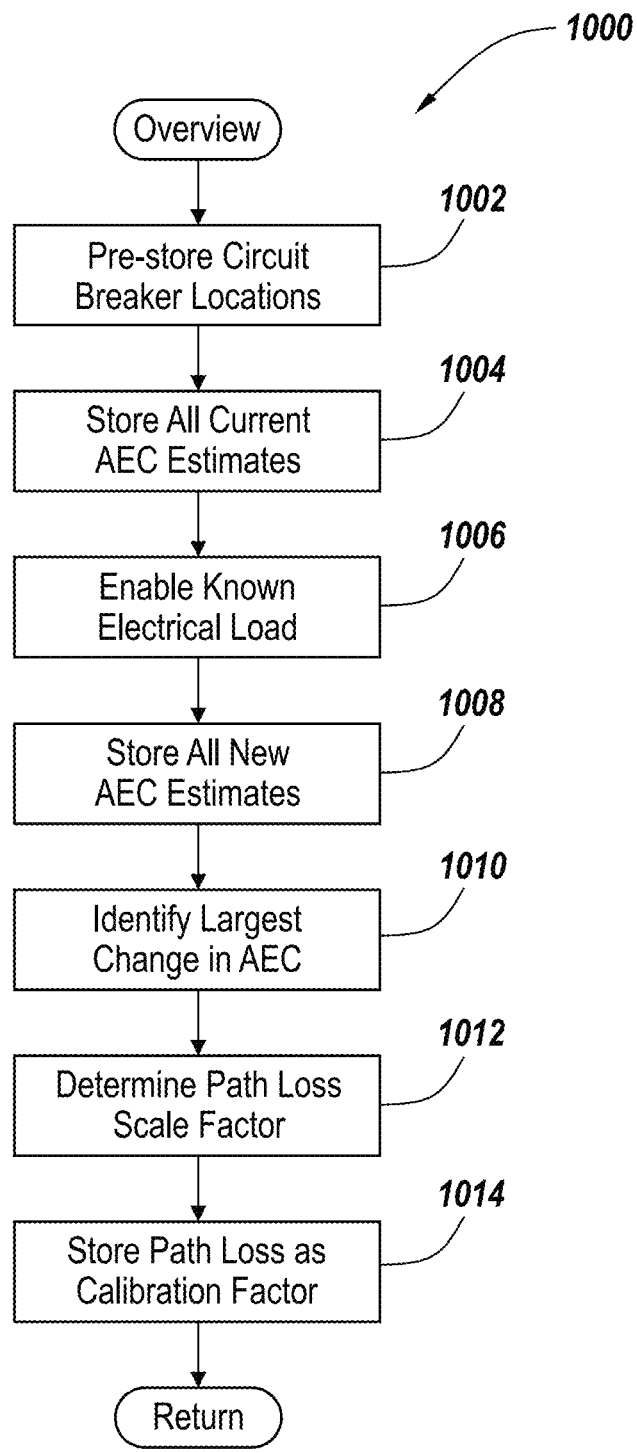
FIG. 10 is a flowchart illustrating the steps that are performed to remove sensor measurement leakage.

An example of automatic path-loss calibration involves the steps 1000 as depicted in FIG. 10. A first step is to pre-store the locations of the circuit breakers 1002, which may be based on defined standards for the electrical panel. The present set of estimates of the AEC may next be stored in step 1004, as a baseline for the calibration. Next, a change in electrical load may be controlled by the measurement system as in step 1006, such as by having known electrical loads such as resistors or LEDs built into the measurement system that can be electronically enabled as needed to perform calibration at a certain point in time. After the load is enabled, the AEC may be recorded on all sensors in step 1008. The sensor showing the largest change in electromagnetic field strength may be identified in step 1010 and may be presumed to be the sensor that is local to the circuit breaker supplying current to the known electrical load, with all other sensors deemed to be distant. Based on known locations of the circuit breakers, the known change in electrical load, and the AEC at each sensor before and after the known load, the scale factor for the path loss may be estimated in step 1012 and stored in step 1014 for subsequent use.

Matrix F is not sparse, but element values within F fall off quickly such that structural approximations may be possible without significant numerical impact. In particular, low leakage (high path loss) leads to few non-zeros in $F_k$ and can yield an N-diagonal banded matrix with appropriate structuring. Solvers that exploit Hermitian-symmetric banded matrices can be very efficient.

Machine Intelligence

The exemplary embodiments may provide insight into specific electric consumption and production activity, such as which electrical devices are running and for how long, by inference that is generated from the monitoring of electricity consumption and production patterns unique to the device or machine, or by the presence of harmonics and other noise generated by the electrical devices that propagate back to the point of the electromagnetic sensors and appear in the sensor data samples. Examples of electrical device activities that may be identified by such exemplary embodiments include:

opening or closing of a garage door and its time of occurrence the times that a dishwasher starts and stops during the day how often a television is turned on how often a water heater runs how often a pool filter is running how much electricity is being produced by a solar array if a clothes iron is left plugged in if an electric stove is turned on The sensor data obtained by the electromagnetic sensors, such as described above, may be processed and analyzed by a machine intelligence system that has been specially trained using machine learning techniques to recognize activities relevant to the installation site, such as activities relevant to a commercial factory or to a residential home. In this manner, not only may current consumption information be communicated, but inference about electrical activities and their timing of occurrence may be provided. Additional insight can be offered based on those inferences, such as ways to reduce electricity consumption, warnings about electric devices that have been left operating for an excessive duration of time, best timing for running certain electrical machinery to take advantage of preferential electricity rates from a supplier, or predictive maintenance of those devices based on length or intensity of operation. Systems that incorporate machine intelligence have been appearing recently, especially in areas related to perception and sensor processing systems, such as those intended for computer vision systems and automated driving applications. These recent techniques are specialized and applied herein to the problem of inferring electricity usage by electric devices and the corresponding electrical activities based on the AEC measurement technique disclosed above.

Figure 11:
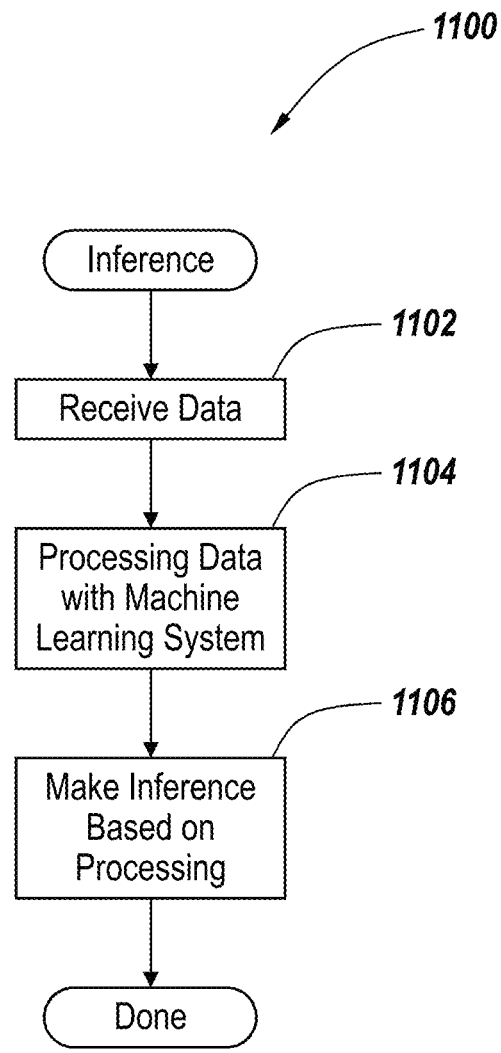
FIG. 11 is a flowchart illustrating the steps that may be performed by a machine learning system to make inferences regarding electrical consumption activity.

FIG. 11 depicts a flowchart 1100 of the steps that may be performed by a machine learning system in exemplary embodiments. Initially, the machine learning system receives the data (step 1012). This data may comprise either AEC or AEF measurements. The data may be received on an ongoing basis or in batches. The machine intelligence system then processes the data (step 1104) against a pre-trained learning network. The processing results in an inference pertaining to the data, such as that a certain electrical device is turned on, is running at a certain intensity, or was recently turned off (step 1106).

The machine intelligence system utilized for the purpose of inferring activity based on the data may be trained based on, for example, one of three basic types of machine learning algorithms: supervised learning (such as regression and decision trees), unsupervised learning (such as data clustering and k-means clustering) and reinforcement learning (such as Markov decision processes). Other approaches to training may also be utilized.

Figure 12:
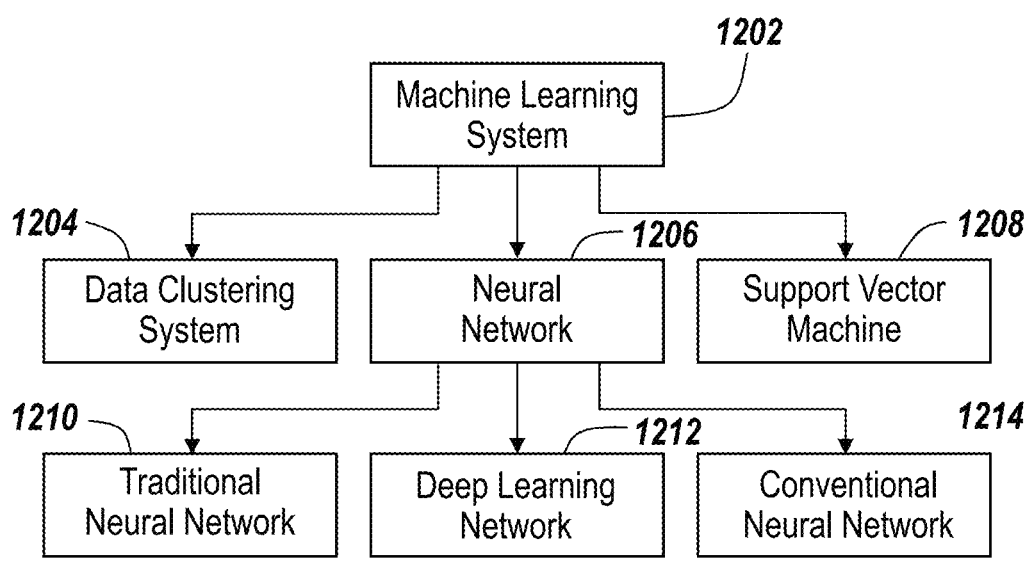
FIG. 12 depicts examples of different types of machine learning systems that may be deployed in exemplary embodiments.

FIG. 12 depicts a number of the different varieties of machine learning systems that may be used in the exemplary embodiments. The machine learning system 1202 may deploy, for example, a data clustering system 1204. Alternatively, the machine learning system 1202 may deploy a neural network 1206 or a support vector machine 1208. A variety of different types of neural networks may be deployed. For example, a traditional neural network 1210 may be deployed. A deep learning neural network 1212 may be deployed or a convolutional neural network 1214 may be deployed. It should be appreciated that neural networks that combine components from the various types of networks may be deployed as well. The depiction in FIG. 12 is intended to be exemplary and not exhaustive.

For example, deep learning networks (DLNs) that utilize artificial neural networks (ANNs) may be used. Deep learning networks may include deep neural networks (DNNs) and convolutional neural networks (CNNs) for instance. DLNs may be trained based on sensor data that corresponds to known activities, and that data-driven training may be done prior to using the system for activity inference. Applying these systems to the non-contact AEC measurement system described herein can provide additional benefits that have not been achieved with other conventional approaches.

A key design element of a CNN is the choice of layers that constitute the network, sometimes referred to as the network topology. A CNN consists of a number of layers, each of which provide certain mathematical computations or data processing steps that support the recognition task that the CNN is designed to perform. Typically, the network has a number of convolutional layers, subsampling layers, non-linear layers, fully-connected layers, downsampling or pooling layers, and so on. The choice of network topology for tasks such as face recognition when used with images has been well documented. The choice of topology for sensor analysis and inference from AEF measurements have not been well considered. For the exemplary inference tasks cited above, preferred network topologies have been discovered that provide high rates of recognition yet place reasonably low computational demands on the processor, so that the inference can be handled in a system with a low-power dedicated processor.

Assuming a non-contact sensor approach to measuring AEC as detailed above, and choosing a CNN as an example machine learning system, initially the CNN is trained using processed sensor samples that are measured in response to the known activity of electrical machines and devices. For example, sensor data may be recorded for a period of time while a dishwasher is running during its wash cycle, and again while it is running with its dry cycle. With sufficient data recorded corresponding to each type of activity desired for identification, the CNN may be trained to recognize and identify the activity automatically. Such training of the CNN may consume hours or days of computation on a separate system for training the CNN, based on the recorded data sets and known activities, until the rate of correct activity recognition is sufficiently high. Once fully trained, the parameters (e.g., the weights and coefficients) of the trained machine learning network can be recorded in stored memory or on other persistent media, and built into the AEC sensor processing system for inference when deployed at the site in which electrical activity is being monitored.

Another element of a machine intelligence system that is specially adapted for use with the electromagnetic measurement system as described herein is the use of multiple axes of directional information from a multi-axis electromagnetic sensor. The ability of a machine learning system to learn from the data relies on the presence of features within the data that can reliably distinguish one type of inference from another—say, to enable distinguishing the operation of an LED light versus a phone charger, or an oven versus a hot water heater, based on the consumption characteristics over brief intervals of time. The distinguishing features of the data can be transient aspects of the electromagnetic field, such as pulsation or level shifts in the field as detected by an appropriate sensor. The electromagnetic field also changes in corresponding but highly complex relationship to those transient pulsations and level shifts. A well-known aspect of a machine learning network, and especially of a deep learning network, is that these highly complex relationships do not need to be determined explicitly by the designer of the system, and the instead the system learns the relationship through the course of training on known data. Distinguishing features may therefore be obtained from the dynamics of the electromagnetic field strength over the three principal directions of the field, without an explicit and highly complex physical relationship being established a-priori. Since magnetic fields are vector fields, they exhibit differences in field strength independently in each of the three principal directions of the field. These shifts in the vector field over short periods of time occur in response to those transients and level shifts, and are exploited to increase the likelihood of correct inference when distinguishing which electrical machinery is operating and its current state of operation. Therefore, a unique element of the system described herein is to enable inference of electrical machine activity based on a machine intelligence system that utilizes electromagnetic strength for at least one individual and independent axis of sensor measurement of a vector field, not just the aggregate (also known as the scalar or magnitude) field strength sampled at a point in space. A typical implementation of this is for a 3-axis magnetometer, wherein the independent magnetic measurements on one, two or three of the independent axes of measurement are presented to the machine intelligence system for training and for inference when the system is under operation.

The machine learning system may be realized by instructions executed on a processor, such as processor 108 (FIG. 1) that was described above. As was described above, the processor 108 may be resident on device 106 that may be local remote. When the device 106 and processor 108 are located remotely, the AEC system may implement a communications protocol such that it can access a computer network, either wired or wireless. In such a case, the measurement system may rely on one or more processors located distant from the measurement system itself that perform the inference computation. This allows the inference to be perform "in the cloud." When provisioned in such a manner, the system for measuring AEC can rely on significant computational facilities that are sited remote from AEC measurement system. The data needed by the machine learning inference system can be communicate from the measurement device, over the network, and to the remote computational facility that performs the inference. The result of that inference can be communicated directly to the user or customer of the system such as via an email message, a mobile device text message, or to a computer that is accessible by some other means to the remote computational facility. Finally, the inference results may be transferred back to the system performing the AEC measurement, and that measurement system can communicate the result to the user local to the point of measurement itself.

While the present invention has been described with reference to exemplary embodiments herein, those skilled in the art will appreciate the various changes in form in detail may be made without departing from the intended scope of the present invention as defined in the appended claims.

What is claimed as new and desired to be protected by Letters Patent of the United States is:

1. In a device having a processor, a method comprising:
   receiving two or more unsynchronized samples of data from at least one non-contact sensor of electromagnetic energy positioned in proximity to a circuit breaker body through which alternating electric current flows, with the processor;

estimating an electromagnetic field strength based on the received two or more samples of data; and displaying on a display, storing in a storage and/or passing to an application information regarding the alternating electromagnetic field strength, wherein the two or more samples of data are taken at a sampling interval that is longer than a Nyquist interval for a frequency of the alternating electric current.

2. The method of claim 1 further comprising determining alternating electric current amplitude for the alternating current flowing through the circuit breaker body corresponding to the estimated electromagnetic field strength; and displaying on the display or storing in a storage information regarding the alternating electric current amplitude flowing through the circuit breaker body.

3. The method of claim 1 wherein the two or more samples of data are values of magnetic field strength.

4. The method of claim 1 wherein the two or more samples of data are received from at least one three-axis magnetometer.

5. The method of claim 1 wherein the two or more samples of data are received from multiple non-contact sensors.

6. The method of claim 1 wherein the estimating the electromagnetic field strength comprises estimating electromagnetic field strength for a first alternating electric current frequency and for a second alternating electric current frequency.

7. The method of claim 6 wherein a larger of the estimated electromagnetic field strength for the first alternating electric current frequency and the estimated electromagnetic field strength for the second alternating electric current frequency is used to estimate the frequency of the alternating electric current flowing through the circuit breaker body.

8. The method of claim 7 further comprising storing in the storage, displaying on the display and/or passing to the application an alternating electric current frequency.

9. The method of claim 1 wherein the estimating electromagnetic field strength comprises determining a peak amplitude of the alternating electromagnetic field.

10. The method of claim 9 wherein the determining of peak amplitude of the electromagnetic field comprises applying a least squares estimator.

11. The method of claim 9 wherein the determining of peak amplitude of the electromagnetic field comprises applying a minimum-variance unbiased estimator.

12. The method of claim 1 wherein the at least one non-contact sensor smoothes samples of data over time and wherein the method further comprises, with the processor, compensating for the smoothing of the samples.

13. The method of claim 1 wherein the estimating electromagnetic field strength comprises determining a value with a predetermined relationship to the amplitude of the electromagnetic field.

14. The method of claim 13 wherein the determining of peak amplitude of the electromagnetic field comprises applying a least squares estimator.

15. The method of claim 13 wherein the determining of peak amplitude of the electromagnetic field comprises applying a minimum-variance unbiased estimator.

16. The method of claim 1 further comprising reducing sensor measurement leakage by performing a computation to remove leakage from the samples of data.

17. The method of claim 16 wherein the reducing sensor measurement leakage utilizes a path loss estimate.

18. The method of claim 17 wherein the path loss estimate is determined by performing a calibration step involving enabling a known electric load.

19. The method of claim 1, further comprising inferring electric consumption or production activity based on the estimated electromagnetic field strength.

20. The method of claim 19, wherein the inferring is based on processing by a data clustering implementation, a support vector machine, a neural network, a deep learning network or a convolutional neural network executed on the processor.

21. The method of claim 1, further comprising inferring electric consumption or production activity based on estimated electric current amplitude.

22. The method of claim 21, wherein the inferring is based on processing of one or more independent axes of magnetic field strength measurements by a data clustering implementation, a support vector machine, a neural network, a deep learning network or a convolutional neural network executed on the processor.

23. A non-transitory computer-readable storage medium storing instructions that when executed on a processor cause the processor to perform the following:

receiving two or more unsynchronized samples of data from at least one non-contact sensor of electromagnetic field strength positioned in proximity to a circuit breaker body through which alternating electric current flows;

estimating an electromagnetic field strength based on the received two or more samples of data;

determining alternating electric current amplitude for the alternating electric current flowing through the circuit breaker body from the estimated electromagnetic field strength; and displaying on a display, storing and/or passing to an application in a storage information regarding the alternating current amplitude flowing through the circuit breaker body, wherein the two or more samples of data are taken at a sampling interval that is longer than a Nyquist interval for an alternation frequency of the alternating electric current.

24. The non-transitory computer-readable storage medium of claim 23, wherein the two or more samples of data are samples of magnetic field data.

25. The non-transitory computer-readable storage medium of claim 23, wherein the two or more samples of data are received from at least one three-axis magnetometer.

26. The non-transitory computer-readable storage medium of claim 23 wherein the two or more samples of data are received from multiple non-contact sensors.

27. The non-transitory computer-readable storage medium of claim 23 wherein the estimating the electromagnetic field strength comprises estimating electromagnetic field strength for a first alternating electric current frequency and for a second alternating electric current frequency.

28. The non-transitory computer-readable storage medium of claim 27 wherein a larger of the estimated electromagnetic field strength for the first alternating electric current frequency and the estimated electromagnetic field strength for the second alternating electric current frequency is used as the estimated electromagnetic field strength.

29. The non-transitory computer-readable storage medium of claim 28 further storing instructions for storing in the storage, and/or passing to the application displaying on the display a frequency of the estimated electromagnetic field strength that is used as the frequency of the estimated alternating electromagnetic field.

30. The non-transitory computer-readable storage medium of claim 23 wherein the estimating an electromagnetic field strength comprises determining an amplitude of the electromagnetic field at an alternation frequency.

31. The non-transitory computer-readable storage medium of claim 30 wherein the determining of amplitude of the electromagnetic field comprises applying a least squares estimator.

32. The non-transitory computer-readable storage medium of claim 30 wherein the determining of amplitude of the electromagnetic field comprises applying a minimum-variance unbiased estimator.

33. The non-transitory computer-readable storage medium of claim 23 wherein the at least one non-contact sensor smoothes samples of data over time and wherein the method further comprises, with the processor, compensating for the smoothing of the samples.

34. The non-transitory computer-readable storage medium of claim 23 wherein the estimating electromagnetic field strength comprises determining an amplitude of the electromagnetic field.

35. The non-transitory computer-readable storage medium of claim 34 wherein the determining of an amplitude of an electromagnetic field comprises applying a least squares estimation.

36. The non-transitory computer-readable storage medium of claim 23 further comprising reducing sensor measurement leakage by performing a computation to remove leakage from the samples of data.

37. The non-transitory computer-readable storage medium of claim 36 wherein the reducing sensor measurement leakage utilizes a path loss estimate.

38. The non-transitory computer-readable storage medium of claim 37 wherein the path loss estimate is determined by performing a calibration step involving enabling a known electric load.

39. The non-transitory computer-readable storage medium of claim 23, further storing instructions for inferring electric consumption or production activity based on the estimated electromagnetic field strength.

40. The non-transitory computer-readable storage medium of claim 39, wherein the inferring is based on processing by a data clustering implementation, a support vector machine, a neural network, a deep learning network or a convolutional neural network executed on the processor.

41. The non-transitory computer-readable storage medium of claim 23, further storing instructions for inferring electric consumption or production activity based on estimated electric current amplitude.

42. The non-transitory computer-readable storage medium of claim 41, wherein the inferring is based on processing by a data clustering implementation, a support vector machine, a neural network, a deep learning network or a convolutional neural network executed on the processor.

43. In a device having a processor, a method comprising:
receiving two or more unsynchronized samples of data from at least one non-contact sensor of electromagnetic energy positioned in proximity to a circuit breaker body through which alternating electric current flows, with the processor;
estimating an electromagnetic field strength based on the received two or more samples of data; and
displaying on a display, storing in a storage and/or passing to an application information regarding the alternating electromagnetic field strength, and
reducing sensor measurement leakage by performing a computation to remove leakage from the samples of data.

* * * * *